United States Patent
Forster et al.

(10) Patent No.: US 12,489,426 B2
(45) Date of Patent: Dec. 2, 2025

(54) SURFACE-ACOUSTIC-WAVE (SAW) FILTER WITH AN ELECTRICAL CONDUCTOR HAVING A FLOATING POTENTIAL

(71) Applicant: RF360 SINGAPORE PTE. LTD., Republic Plaza (SG)

(72) Inventors: Thomas Forster, Munich (DE); Markus Mayer, Taufkirchen (DE); Vikrant Chauhan, Munich (DE); Stefan Ammann, Grosskarolinenfeld (DE); Manuel Sabbagh, Dorfen (DE); Stefan Freisleben, Neubiberg (DE)

(73) Assignee: RF360 Singapore Pte. Ltd., Republic Plaza (SG)

(*) Notice: Subject to any disclaimer, the term of this patent is extended or adjusted under 35 U.S.C. 154(b) by 925 days.

(21) Appl. No.: 17/651,211

(22) Filed: Feb. 15, 2022

(65) Prior Publication Data
US 2023/0261641 A1   Aug. 17, 2023

(51) Int. Cl.
*H03H 9/02* (2006.01)
*H03H 3/08* (2006.01)
*H03H 9/145* (2006.01)
*H03H 9/64* (2006.01)
*H04B 1/40* (2015.01)

(52) U.S. Cl.
CPC ............ *H03H 9/6489* (2013.01); *H03H 3/08* (2013.01); *H03H 9/02992* (2013.01); *H03H 9/14544* (2013.01); *H04B 1/40* (2013.01)

(58) Field of Classification Search
CPC ........... H03H 9/02992; H03H 9/14544; H03H 9/02535

USPC ...... 310/313 R, 313 A, 313 B, 313 C, 313 D
See application file for complete search history.

(56) References Cited

U.S. PATENT DOCUMENTS

| | | | |
|---|---|---|---|
| 2006/0158061 A1 | 7/2006 | Hauser et al. | |
| 2016/0126928 A1* | 5/2016 | Ruile | H03H 9/25 |
| | | | 310/313 B |
| 2017/0170808 A1 | 6/2017 | Iwaki et al. | |
| 2020/0244247 A1 | 7/2020 | Maeda | |
| 2022/0271734 A1* | 8/2022 | Abbott | H03H 9/6483 |

FOREIGN PATENT DOCUMENTS

| | | |
|---|---|---|
| JP | H0946163 A | 2/1997 |
| WO | 2012084460 A1 | 6/2012 |

OTHER PUBLICATIONS

International Search Report and Written Opinion—PCT/EP2023/050913—ISA/EPO—Apr. 21, 2023, 21 pages.

* cited by examiner

*Primary Examiner* — Derek J Rosenau
(74) *Attorney, Agent, or Firm* — Polsinelli/Qualcomm

(57) ABSTRACT

An apparatus is disclosed for a surface-acoustic-wave filter with an electrical conductor having a floating potential. In an example aspect, the apparatus includes a surface-acoustic-wave filter with a piezoelectric layer and an electrode structure disposed on a surface of the piezoelectric layer. The electrode structure includes a first comb-shaped structure and a second comb-shaped structure. The electrode structure also includes at least one electrical conductor positioned between the first comb-shaped structure and the second comb-shaped structure such that a gap separates the at least one electrical conductor from the first comb-shaped structure and the second comb-shaped structure.

32 Claims, 12 Drawing Sheets

SURFACE-ACOUSTIC-WAVE (SAW) FILTER WITH AN ELECTRICAL CONDUCTOR HAVING A FLOATING POTENTIAL

TECHNICAL FIELD

This disclosure relates generally to wireless transceivers and other components that employ filters and, more specifically, to a surface-acoustic-wave (SAW) filter with an electrical conductor having a floating potential.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for high-frequency applications, including those that utilize frequencies above 2 gigahertz (GHz), while preventing or reducing spurious modes across a frequency response of the filter.

SUMMARY

An apparatus is disclosed that implements a surface-acoustic-wave (SAW) filter with an electrical conductor having a floating potential. In example implementations, the surface-acoustic-wave filter includes at least one electrical conductor within a barrier region. The electrical conductor is surrounded by a gap, which separates the electrical conductor from other components of an electrode structure of the surface-acoustic-wave filter. Without a direct electrical connection to these components, the electrical conductor has a floating potential. This enables the electrical conductor to reduce a magnitude of an electric field and/or a local capacitance of the surface-acoustic-wave filter in a transversal direction. By reducing the electric field, the electrical conductor can cause a spurious frequency of the surface-acoustic-wave filter, such as a second-order harmonic frequency, to be generated with a smaller amplitude compared to other surface-acoustic-wave filters that do not utilize the electrical conductor.

In an example aspect, an apparatus for filtering is disclosed. The apparatus includes a surface-acoustic-wave filter with a piezoelectric layer and an electrode structure disposed on a surface of the piezoelectric layer. The electrode structure includes a first comb-shaped structure and a second comb-shaped structure. The electrode structure also includes at least one electrical conductor positioned between the first comb-shaped structure and the second comb-shaped structure such that a gap separates the at least one electrical conductor from the first comb-shaped structure and the second comb-shaped structure.

In an example aspect, an apparatus for filtering is disclosed. The apparatus includes a surface-acoustic-wave filter configured to generate a filtered signal from a radio-frequency signal. The surface-acoustic-wave filter includes means for converting the radio-frequency signal to an acoustic wave and converting a propagated acoustic wave into the filtered signal using two potentials. The surface-acoustic-wave filter also includes conduction means for providing a floating potential between the two potentials.

In an example aspect, a method for manufacturing a surface-acoustic-wave filter is disclosed. The method includes providing a piezoelectric layer and providing an electrode structure on a surface of the piezoelectric layer. The providing of the electrode structure includes forming a first comb-shaped structure and forming a second comb-shaped structure. The providing of the electrode structure also includes forming at least one electrical conductor between the first comb-shaped structure and the second comb-shaped structure such that a gap separates the at least one electrical conductor from the first comb-shaped structure and the second comb-shaped structure.

In an example aspect, a surface-acoustic-wave filter is disclosed. The surface-acoustic-wave filter includes an electrode structure. The electrode structure includes two comb-shaped structures configured to have different potentials. The two comb-shaped structures form a barrier region between a busbar of one of the two comb-shaped structures and fingers of another one of the two comb-shaped structures. The electrode structure also includes at least one electrical conductor positioned within the barrier region and configured to have a floating potential.

BRIEF DESCRIPTION OF DRAWINGS

FIG. 4-1 illustrates an example implementation of a thin-film surface-acoustic-wave filter with an electrical conductor having a floating potential.

FIG. 4-2 illustrates an example implementation of a high-quality temperature-compensated surface-acoustic-wave filter with an electrical conductor having a floating potential.

DETAILED DESCRIPTION

Figure 1:
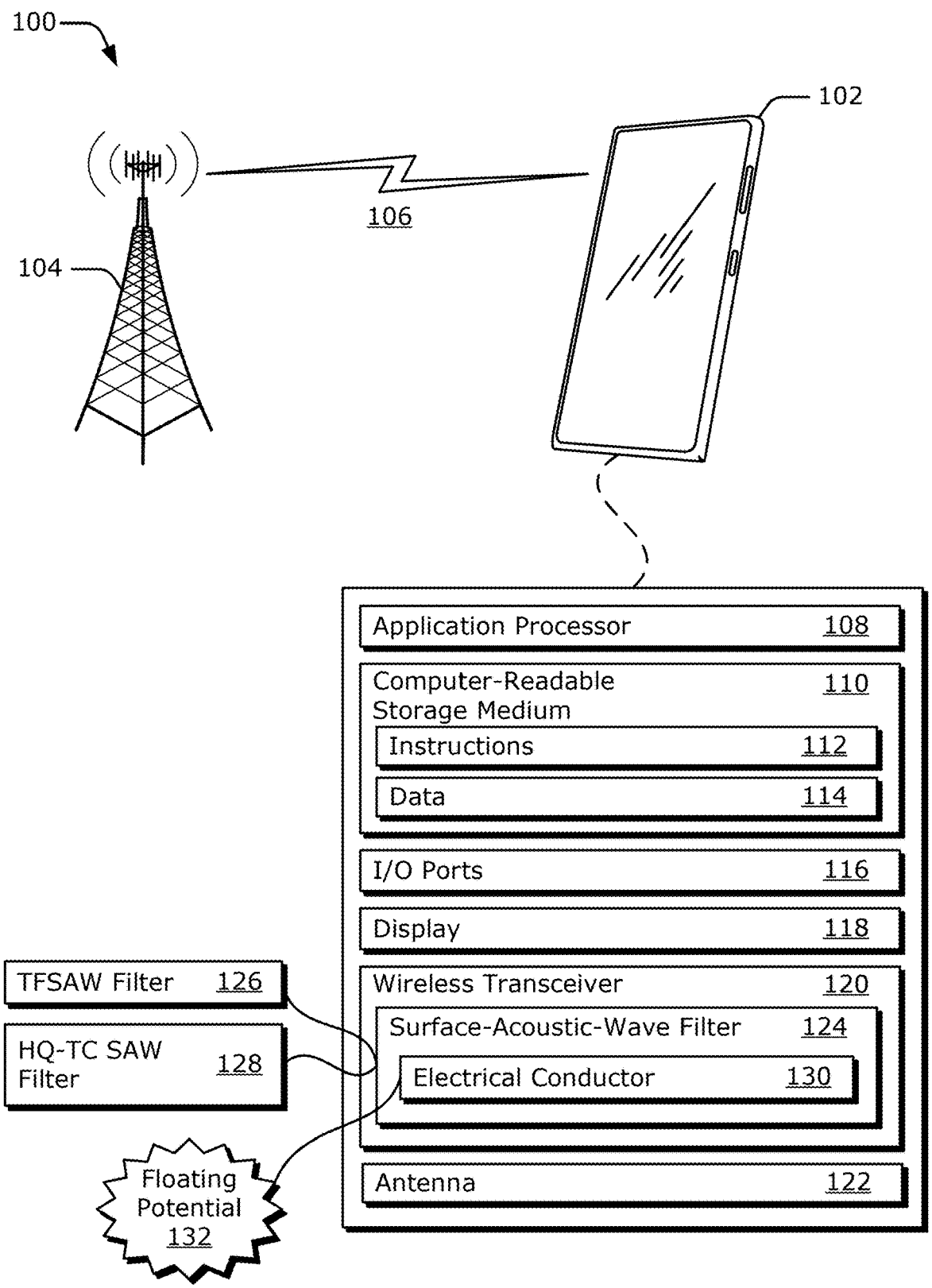
FIG. 1 illustrates an example operating environment for a surface-acoustic-wave filter with an electrical conductor having a floating potential.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using a piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave propagates across the piezoelectric material at a velocity having a magnitude that is significantly less than that of the propagation velocity of the electrical wave. Generally, the magnitude of the propagation velocity of a wave is proportional to a size of a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design an acoustic filter that can provide filtering for high-frequency applications, including those that utilize frequencies above 2 gigahertz. (GHz), while attenuating or suppressing spurious frequencies. A spurious frequency is an undesired frequency, such as a harmonic frequency (e.g., a second-order harmonic frequency) or an intermodulation product. In some cases, the spurious frequency can desensitize a receiver of the electronic device. To address this, some electronic devices design acoustic filters with cascading resonators, which can be arranged in series, in parallel, in a ladder structure, in a lattice structure, or some combination thereof. The cascading resonators, however, utilize additional space within the electronic device, which can make it challenging to implement within space-constrained devices, such as mobile devices.

To provide certain performance improvements, a surface-acoustic-wave (SAW) filter with an electrical conductor having a floating potential is described. In example implementations, the surface-acoustic-wave filter includes at least one electrical conductor within a barrier region. The electrical conductor is surrounded by a gap, which separates the electrical conductor from other components of an electrode structure of the surface-acoustic-wave filter. Without a direct electrical connection to these components, the electrical conductor has a floating potential. This enables the electrical conductor to reduce a magnitude of an electric field and/or a local capacitance of the surface-acoustic-wave filter in a transversal direction. By reducing the electric field, the electrical conductor can cause a spurious frequency of the surface-acoustic-wave filter, such as a second-order harmonic frequency, to be generated with a smaller amplitude compared to other surface-acoustic-wave filters that do not utilize the electrical conductor. These techniques can be used with, and provide benefits for, acoustic filters that support frequencies above 2 GHz as well as for other acoustic filters that support frequencies below 2 GHZ.

FIG. 1 illustrates an example environment 100 for a surface-acoustic-wave filter with an electrical conductor having a floating potential. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular: IEEE 802.11 (e.g., Wi-Fi®): IEEE 802.15 (e.g., Bluetooth®): IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one surface-acoustic-wave filter 124. In some implementations, the wireless transceiver 120 includes multiple surface-acoustic-wave filters 124, which can be formed from surface-acoustic-wave resonators arranged in series, in parallel, in a ladder structure, in a lattice structure, or some combination thereof. The surface-acoustic-wave filter 124 can be a thin-film surface-acoustic-wave filter 126 (TFSAW filter 126) or a high-quality temperature-compensated surface-acoustic-wave filter 128 (HQ-TC SAW filter 128). One of ordinary skill in the art can appreciate the variety of other surface-acoustic-wave filters that can also include an electrical conductor with a floating potential.

The surface-acoustic-wave filter 124 includes at least one electrical conductor 130 formed using a conducting material, such as metal. The electrical conductor 130 is placed within a barrier region of the surface-acoustic-wave filter 124 such that a gap or space exists around the electrical conductor 130. The gap separates the electrical conductor 130 from other conducting elements of the surface-acoustic-wave filter 124. The gap is sufficiently large to cause any connecting admittances to be approximately zero. As the electrical conductor 130 is not directly connected (physically or electrically) to a power source or a ground (e.g., to a grounded or non-floating conductor), the electrical conductor 130 can have a floating potential 132 (e.g., a floating voltage). This means that the voltage and current flows within the electrical conductor 130 are influenced by electromagnetic fields and are not due to potential differences between a power source and a ground.

The floating potential 132 enables the electrical conductor 130 to function as a voltage divider to reduce an electric field and/or a local capacitance of the surface-acoustic-wave filter 124 in a transversal direction. By reducing the electric field, the electrical conductor 130 can cause a spurious frequency of the surface-acoustic-wave filter, such as a second-order harmonic frequency, to be generated with a smaller amplitude compared to other surface-acoustic-wave filters that do not utilize the electrical conductor 130. The surface-acoustic-wave filter 124 is further described with respect to FIG. 2.

Figure 2:
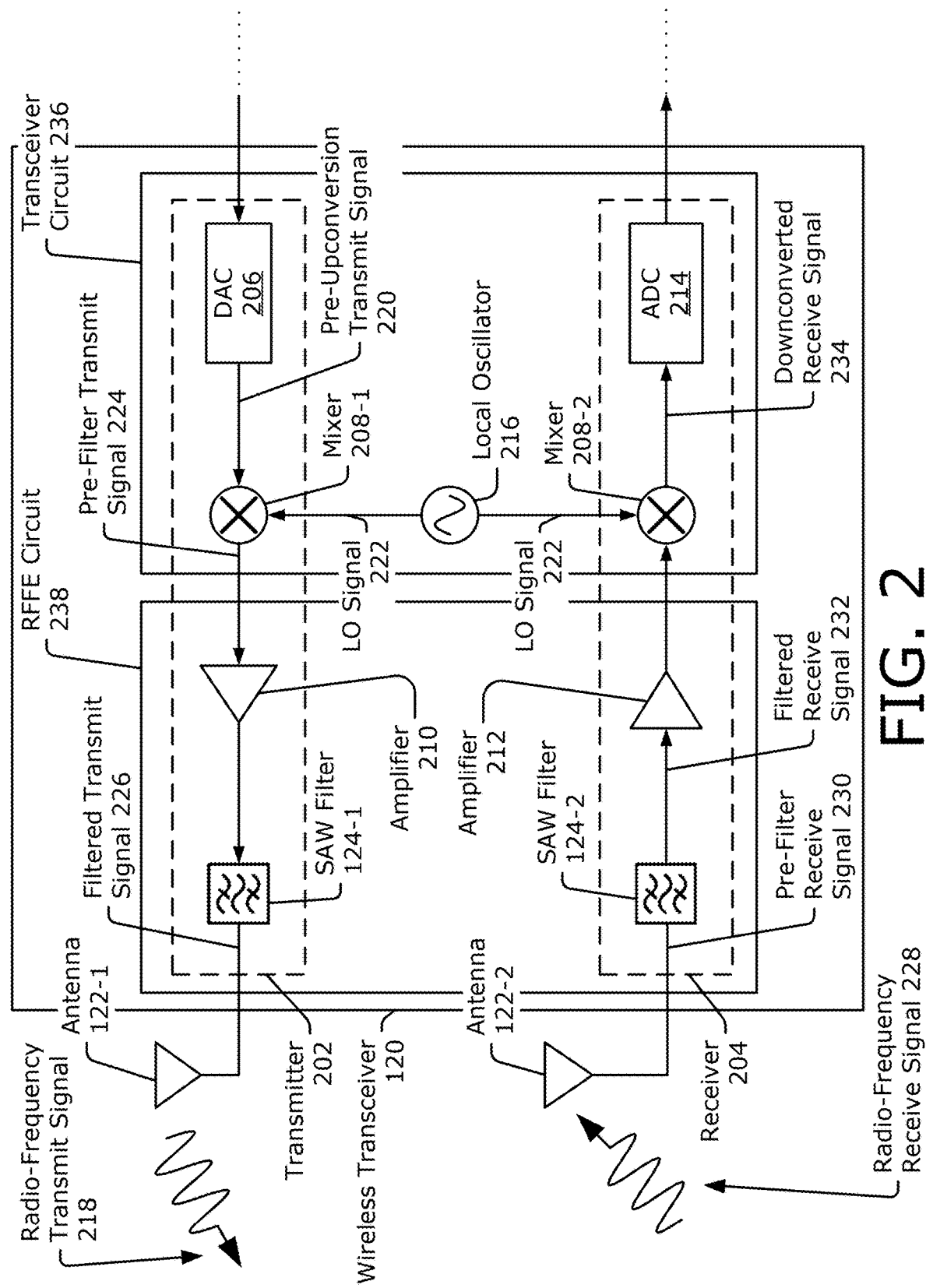
FIG. 2 illustrates an example wireless transceiver including at least one surface-acoustic-wave filter with an electrical conductor having a floating potential.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one first surface-acoustic-wave filter 124-1. The receiver 204 includes at least one second surface-acoustic-wave filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the surface-acoustic-wave filter 124-1 of the transmitter 202, the surface-acoustic-wave filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the first surface-acoustic-wave filter 124-1.

The first surface-acoustic-wave filter 124-1 filters the amplified pre-filter transmit signal 224 to generate a filtered transmit signal 226. As part of the filtering process, the first surface-acoustic-wave filter 124-1 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second surface-acoustic-wave filter 124-2 accepts the received radio-frequency receive signal 228, which is represented by a pre-filter receive signal 230. The second surface-acoustic-wave filter 124-2 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which surface-acoustic-wave filters 124 may be included. For example, the surface-acoustic-wave filters 124 can be integrated within duplexers or diplexers of the wireless transceiver 120. Example implementations of the surface-acoustic-wave filter 124-1 or 124-2 are further described with respect to FIGS. 3 to 4-2.

Figure 3:
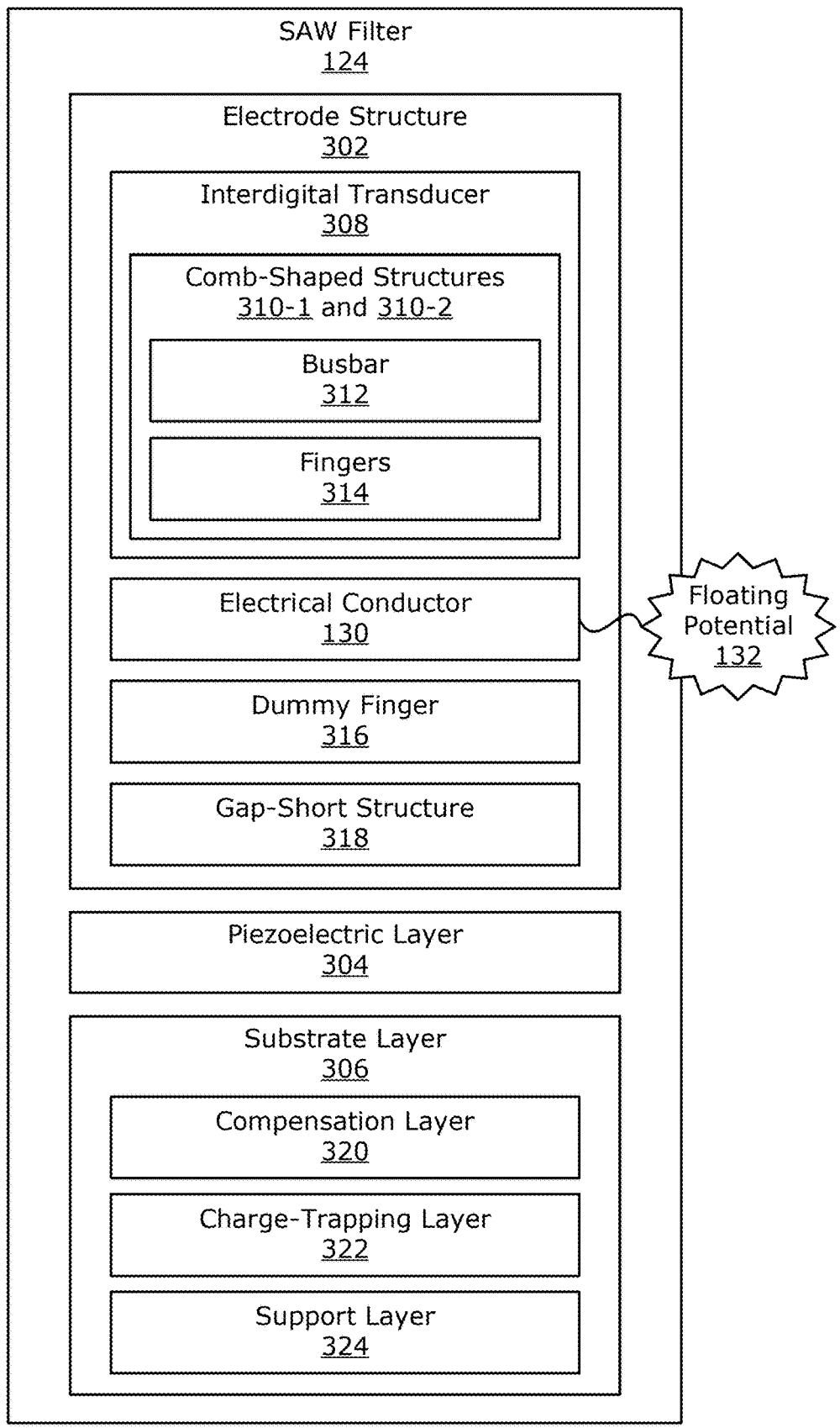
FIG. 3 illustrates example components of a surface-acoustic-wave filter with an electrical conductor having a floating potential.

FIG. 3 illustrates example components of the surface-acoustic-wave filter 124. In the depicted configuration, the surface-acoustic-wave filter 124 includes at least one electrode structure 302, at least one piezoelectric layer 304, and at least one substrate layer 306. The electrode structure 302 comprises an electrically conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), or some combination or doped version thereof. The adhesion layers can be composed of chromium (Cr), titanium (Ti), molybdenum (Mo), or some combination thereof.

The electrode structure 302 can include one or more interdigital transducers 308. The interdigital transducer 308 converts an electrical signal into an acoustic wave and converts the acoustic wave into a filtered electrical signal. The interdigital transducer 308 includes at least two comb-shaped structures 310-1 and 310-2. Each comb-shaped structure includes a busbar 312 (e.g., a conductive segment or rail) and a set of fingers 314 (e.g., electrode fingers). An example interdigital transducer 308 is further described with respect to FIGS. 4-1 and 4-2. Although not explicitly shown, the electrode structure 302 can also include two or more reflectors. In an example implementation, the interdigital transducer 308 is arranged between two reflectors, which reflect the acoustic wave back towards the interdigital transducer 308.

The electrode structure 302 also includes at least one electrical conductor 130, which has the floating potential 132. In aspects, the electrical conductor 130 can be formed using a same material as the comb-shaped structures 310-1 and 310-2 or a different material. The electrical conductor 130 is positioned between the comb-shaped structures 310-1 and 310-2 within a barrier region, as further described with respect to FIGS. 4-1 to 5.

The electrode structure 302 can optionally include one or more dummy fingers 316 (or stub fingers), a gap-short structure 318 (e.g., a gap-short reflector or a transversal reflector), or some combination thereof. One or more dummy fingers 316 can exist between adjacent fingers 314 of the comb-shaped structure 310-1 or 310-2. The dummy fingers 316 are electrode fingers that do not overlap electrode fingers of the opposite electrode. As such, the dummy fingers 316 do not substantially excite longitudinal acoustic waves.

The gap-short structure 318 consists of one or more strips of conductive material that are connected across the fingers 314 of the comb-shaped structure 310-1 or 310-2. In this way, the gap-short structure 318 electrically shorts at least a portion of the barrier region to suppress transversal mode excitations.

In example implementations, the piezoelectric layer 304 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), quartz, aluminium nitride (AlN), aluminium scandium nitride (AlScN), or some combination thereof. In general, the material that forms the piezoelectric layer 304 has a crystalline structure. This crystalline structure is defined by an ordered arrangement of particles (e.g., atoms, ions, or molecules).

The substrate layer 306 includes one or more sublayers that can support passivation, temperature compensation, power handling, mode suppression, and so forth. As an example, the substrate layer 306 can include at least one compensation layer 320, at least one charge-trapping layer 322, at least one support layer 324, or some combination thereof. These sublayers can be considered part of the substrate layer 306 or their own separate layers.

The compensation layer 320 can provide temperature compensation to enable the surface-acoustic-wave filter 124 to achieve a target temperature coefficient of frequency based on the thickness of the piezoelectric layer 304. In some implementations, a thickness of the compensation layer 320 can be tailored to provide mode suppression (e.g., suppress the spurious plate mode). In example implementations, the compensation layer 320 can be implemented using at least one silicon dioxide ($SiO_2$) layer. In some applications, the substrate layer 306 may not include, for instance, the compensation layer 320 to reduce cost of the surface-acoustic-wave filter 124.

The charge-trapping layer 322 can suppress nonlinear substrate effects. The charge-trapping layer 322 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, or some combination thereof.

The support layer 324 can enable the acoustic wave to form across the surface of the piezoelectric layer 304 and reduce the amount of energy that leaks into the substrate layer 306. In some implementations, the support layer 324 can also act as a compensation layer 320. In general, the support layer 324 is composed of material that is non-conducting and provides isolation. For example, the support layer 324 can be formed using silicon (Si) material (e.g., a doped high-resistive silicon material), sapphire material (e.g., aluminium oxide ($Al_2O_3$)), silicon carbide (SiC) material, fused silica material, quartz, glass, diamond, or some combination thereof. In some implementations, the support layer 324 has a relatively similar thermal expansion coefficient (TEC) as the piezoelectric layer 304. The support layer 324 can also have a particular crystal orientation to support the suppression or attenuation of spurious modes.

In some aspects, the surface-acoustic-wave filter 124 can be considered a resonator. Sometimes the surface-acoustic-wave filter 124 can be connected to other resonators associated with different layer stacks than the surface-acoustic-wave filter 124. In other aspects, the surface-acoustic-wave filter 124 can be implemented as multiple interconnected resonators, which use the same layers (e.g., the piezoelectric layer 304 and/or the substrate layer 306). The electrode structure 302, the piezoelectric layer 304, and the substrate layer 306 are further described with respect to FIGS. 4-1 and 4-2.

Figure 4:
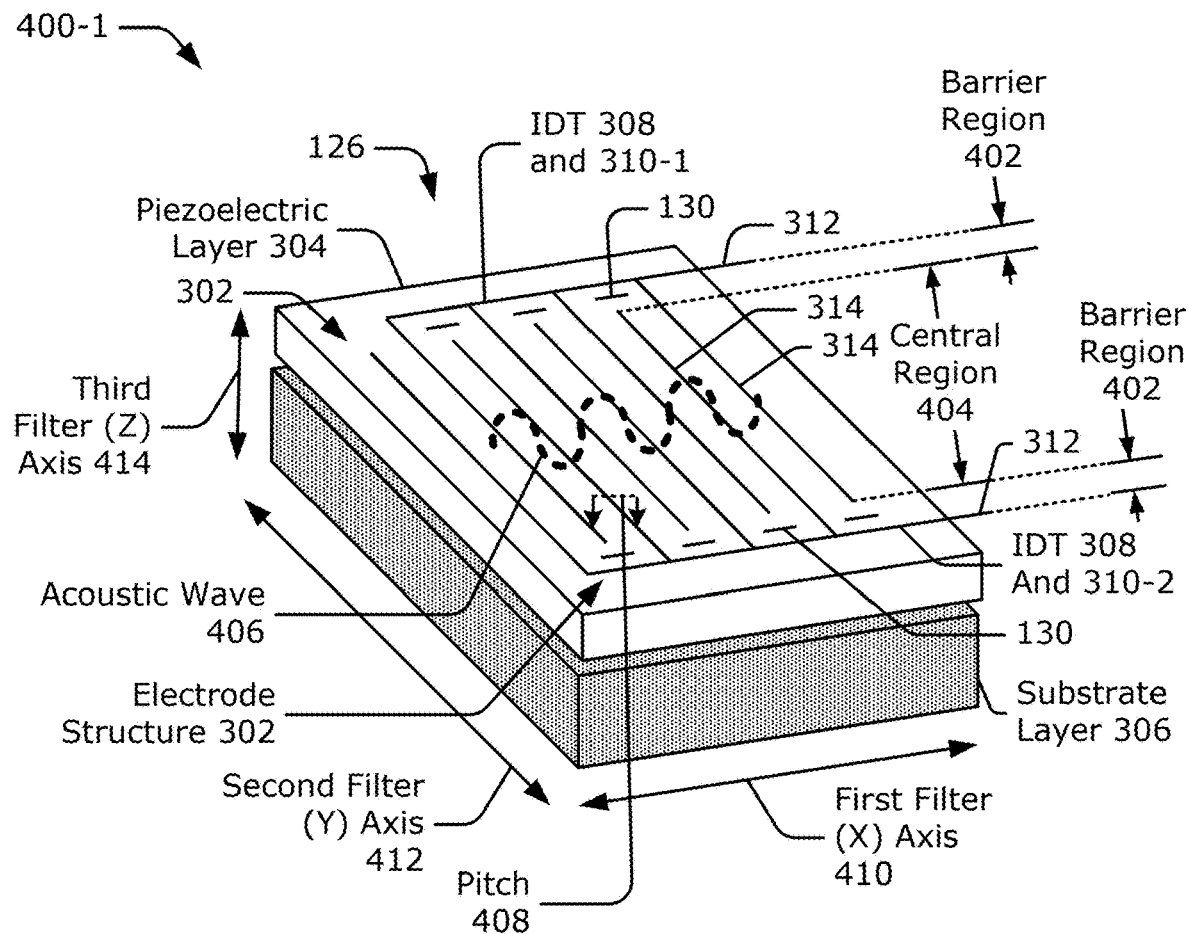
Figure 1:
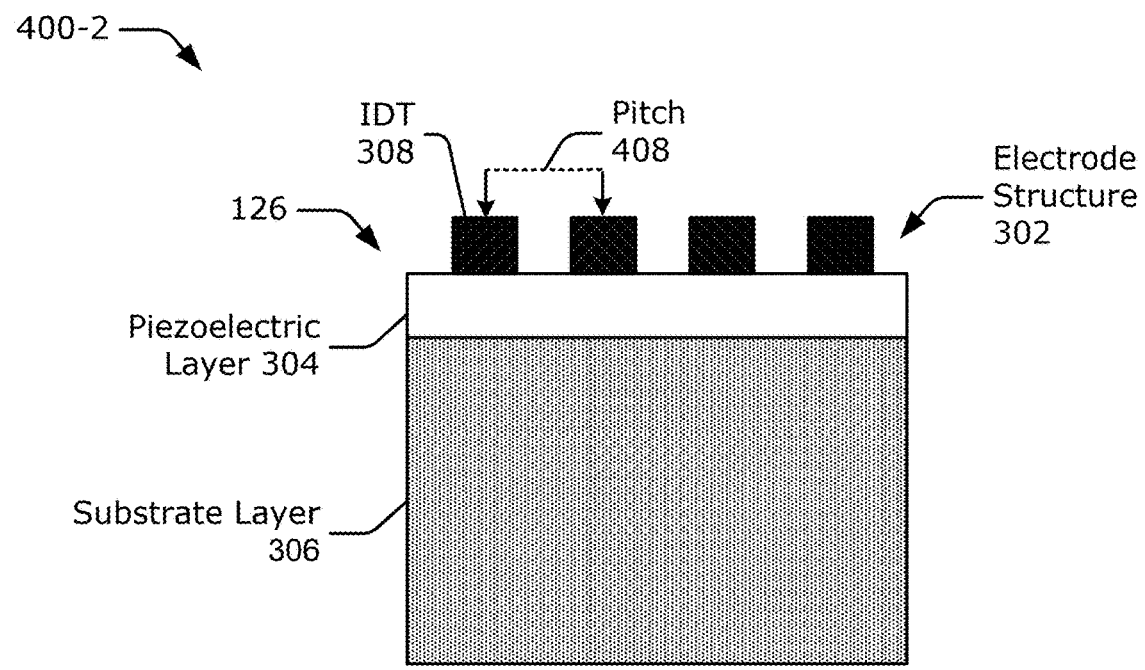
Figure 4:
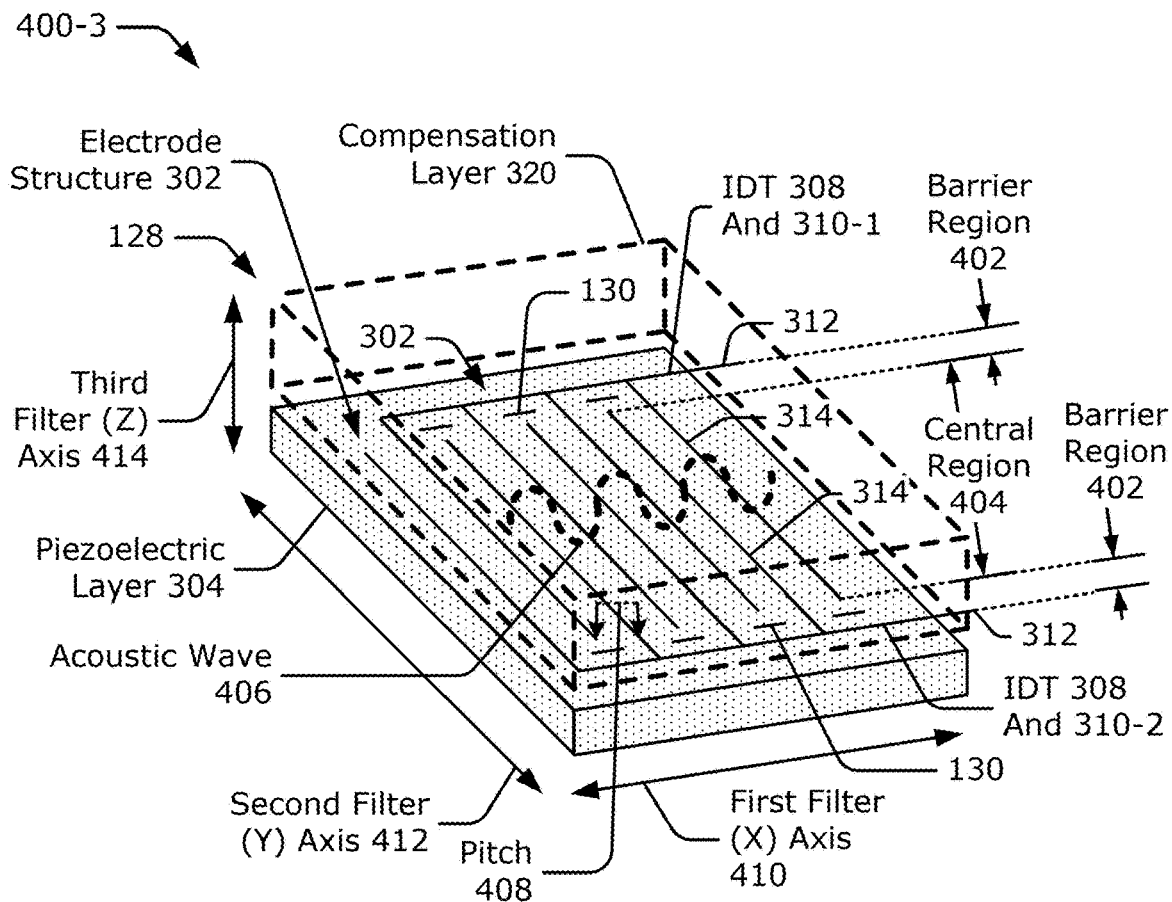
Figure 2:
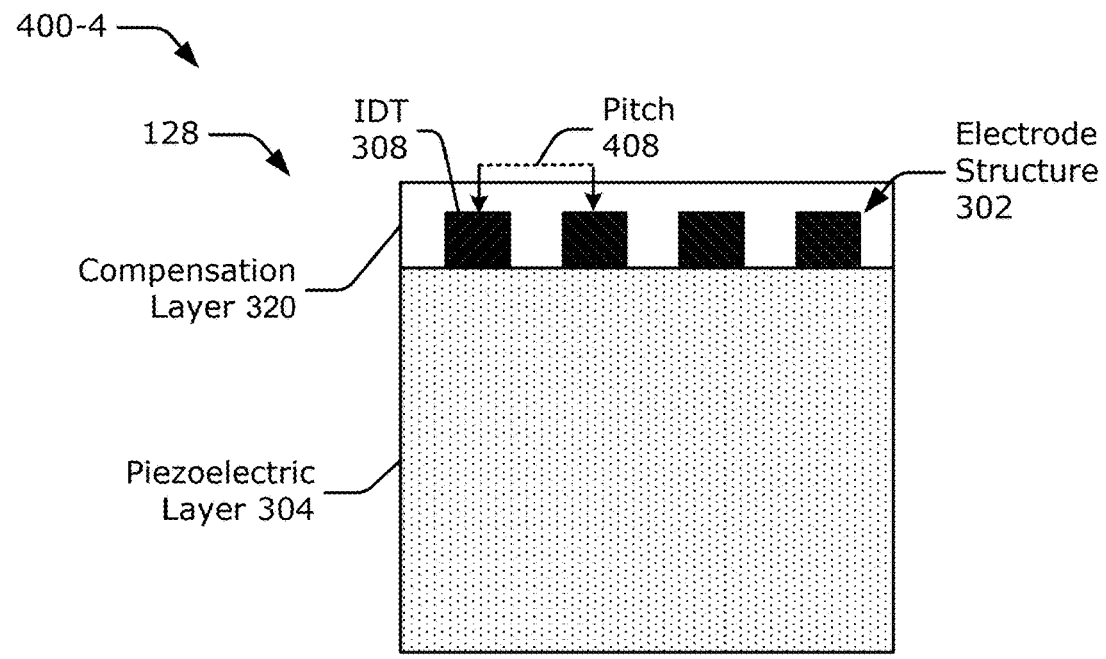

FIG. 4-1 illustrates an example implementation of the thin-film surface-acoustic-wave filter 126 with an electrical conductor 130 having a floating potential 132. A three-dimensional perspective view 400-1 of the thin-film surface-acoustic-wave filter 126 is shown at the top of FIG. 4-1, and a two-dimensional cross-section view 400-2 of the thin-film surface-acoustic-wave filter 126 is shown at the bottom of FIG. 4-1.

The thin-film surface-acoustic-wave filter 126 includes at least one electrode structure 302, at least one piezoelectric layer 304 (e.g., piezoelectric material), and at least one substrate layer 306. The electrode structure 302 can include one or more interdigital transducers 308 and one or more electrical conductors 130. In the depicted configuration shown in the two-dimensional cross-section view: 300-2, the piezoelectric layer 304 is disposed between the electrode structure 302 and the substrate layer 306.

In the three-dimensional perspective view 300-1, the interdigital transducer 308 is shown to have the two comb-shaped structures 310-1 and 310-2 with fingers 314 extending from two busbars 312 towards each other. The fingers 314 are arranged in an interlocking manner in between the two busbars 312 of the interdigital transducer 308 (e.g., arranged in an interdigitated manner). In other words, the fingers 314 connected to a first busbar 312 extend towards a second busbar 312 but do not connect to the second busbar 312. As such, there is a barrier region 402 (e.g., a transversal gap region) between the ends of these fingers and the second busbar. Likewise, fingers 314 connected to the second busbar 312 extend towards the first busbar 312 but do not connect to the first busbar 312. There is therefore a barrier region 402 between the ends of these fingers 314 and the first busbar 312, as further described with respect to FIG. 5.

The electrical conductors 130 are positioned within the barrier region 402 between the two comb-shaped structures 310-1 and 310-2. This enables the electric field and the local capacitance of the surface-acoustic-wave filter 124 to be reduced in the transversal direction (e.g., in a direction along the second filter (Y) axis 412) compared to other surface-acoustic-wave filters that do not include the electrical conductors 130. The electrical conductors 130 are further described with respect to FIGS. 5-9.

In the direction along the busbars 312, there is an overlap region including a central region 404 where a portion of one finger 314 overlaps with a portion of an adjacent finger 314. This central region 404, including the overlap, may be referred to as the aperture, track, or active region where electric fields are produced between fingers 314 to cause an acoustic wave 406 to form at least in this region of the piezoelectric layer 304.

A physical periodicity of the fingers 314 is referred to as a pitch 408 of the interdigital transducer 308. The pitch 408 may be indicated in various ways. For example, in certain aspects, the pitch 408 may correspond to a magnitude of a distance between adjacent fingers 314 of the interdigital transducer 308 in the central region 404. This distance may be defined, for example, as the distance between center points of each of the fingers 314. The distance may be generally measured between a right (or left) edge of one finger 314 and the right (or left) edge of an adjacent finger 314 when the fingers 314 have uniform widths. In certain aspects, an average of distances between adjacent fingers 314 of the interdigital transducer 308 may be used for the pitch 408. The frequency at which the piezoelectric layer 304 vibrates is a main-resonance frequency of the electrode structure 302. The frequency is determined at least in part by the pitch 408 of the interdigital transducer 308 and other properties of the thin-film surface-acoustic-wave filter 126.

In the three-dimensional perspective view 400-1, the thin-film surface-acoustic-wave filter 126 is defined by a first (X) axis 410, a second (Y) axis 412, and a third (Z) axis 414. The first axis 410 and the second axis 412 are parallel to a planar surface of the piezoelectric layer 304, and the second axis 412 is perpendicular to the first axis 410. The third axis 414 is normal (e.g., perpendicular) to the planar surface of the piezoelectric layer 304. The busbars 312 of the interdigital transducer 308 are oriented to be parallel to the first axis 410. The fingers 314 of the interdigital transducer 308 are orientated to be parallel to the second axis 412. Also, an orientation of the piezoelectric layer 304 causes an acoustic wave 406 to mainly form in a direction of the first axis 410. As such, the acoustic wave 406 forms in a direction that is substantially perpendicular to the direction of the fingers 314 of the interdigital transducer 308. Another example type of surface-acoustic-wave filter 124 is further described with respect to FIG. 4-2.

FIG. 4-2 illustrates an example implementation of the high-quality temperature-compensated surface-acoustic-wave filter 128 with the electrical conductor 130 having a floating potential 132. A three-dimensional perspective view 400-3 of the high-quality temperature-compensated surface-acoustic-wave filter 128 is shown at the top of FIG. 4-2, and a two-dimensional cross-section view 400-4 of the high-quality temperature-compensated surface-acoustic-wave filter 128 is shown at the bottom of FIG. 4-2.

The high-quality temperature-compensated surface-acoustic-wave filter 128 includes at least one electrode structure 302, at least one piezoelectric layer 304, and at least one compensation layer 320. The compensation layer 320 can provide temperature compensation to enable the high-quality temperature-compensated surface-acoustic-wave filter 128 to achieve a target temperature coefficient of frequency. In example implementations, the compensation layer 320 can be implemented using at least one silicon dioxide layer.

In the depicted configuration shown in the two-dimensional cross-section view: 400-4, the electrode structure 302 is disposed between the piezoelectric layer 304 and the compensation layer 320. The piezoelectric layer 304 can form a substrate of the high-quality temperature-compensated surface-acoustic-wave filter 128.

The electrode structure 302 of the high-quality temperature-compensated surface-acoustic-wave filter 128 can be similar to the electrode structure 302 described above with respect to the thin-film surface-acoustic-wave filter 126 of FIG. 4-1. Likewise, the piezoelectric layer 304 of the high-quality temperature-compensated surface-acoustic-wave filter 128 can be similar to the piezoelectric layer 304 described above with respect to the thin-film surface-acoustic-wave filter 126 of FIG. 4-1. The piezoelectric layer 304 of the high-quality temperature-compensated surface-acoustic-wave filter 128, however, can be thicker than the piezoelectric layer 304 of the thin-film surface-acoustic-wave filter 126 of FIG. 4-1.

Similar to the thin-film surface-acoustic-wave filter 126 of FIG. 4-1, the high-quality temperature-compensated surface-acoustic-wave filter 128 of FIG. 4-2 can also include the barrier region 402 and the central region 404. The thin-film surface-acoustic-wave filter 126 of FIG. 4-1 and the high-quality temperature-compensated surface-acoustic-wave filter 128 of FIG. 4-2 can have similar operations, which are generally described below with respect to the surface-acoustic-wave filter 124.

During operation, the surface-acoustic-wave filter 124 (e.g., the thin-film surface-acoustic-wave filter 126 of FIG. 4-1 or the high-quality temperature-compensated surface-acoustic-wave filter 128 of FIG. 4-2) accepts a radio-frequency signal, such as the pre-filter transmit signal 224 or the pre-filter receive signal 230 shown in FIG. 2. The electrode structure 302 excites an acoustic wave 406 on the piezoelectric layer 304 using the inverse piezoelectric effect. For example, the interdigital transducer 308 in the electrode structure 302 generates an alternating electric field based on the accepted radio-frequency signal. The piezoelectric layer 304 enables the acoustic wave 406 to be formed in response to the alternating electric field generated by the interdigital transducer 308. In other words, the piezoelectric layer 304 causes, at least partially, the acoustic wave 406 to form responsive to electrical stimulation by one or more interdigital transducers 308.

The acoustic wave 406 propagates across the piezoelectric layer 304 and interacts with the interdigital transducer 308 or another interdigital transducer within the electrode structure 302 (not shown in FIG. 4-1 or 4-2). The acoustic wave 406 that propagates can be a standing wave. In some implementations, two reflectors within the electrode structure 302 cause the acoustic wave 406 to be formed as a standing wave across a portion of the piezoelectric layer 304. In other implementations, the acoustic wave 406 propagates across the piezoelectric layer 304 from the interdigital transducer 308 to another interdigital transducer (not shown).

Using the piezoelectric effect, the electrode structure 302 generates a filtered radio-frequency signal based on the propagated surface acoustic wave 406. In particular, the piezoelectric layer 304 generates an alternating electric field due to the mechanical stress generated by the propagation of the acoustic wave 406. The alternating electric field induces an alternating current in the other interdigital transducer or the interdigital transducer 308. This alternating current forms the filtered radio-frequency signal, which is provided at an output of the surface-acoustic-wave filter 124. The filtered radio-frequency signal can include the filtered transmit signal 226 or the filtered receive signal 232 of FIG. 2.

It should be appreciated that while a certain number of fingers are illustrated in FIGS. 4-1 and 4-2, the number of actual fingers and lengths and width of the fingers and busbars may be different in an actual implementation. Such parameters depend on the particular application and desired filter characteristics. In addition, the thin-film surface-acoustic-wave filter 126 or high-quality temperature-compensated surface-acoustic-wave filter 128 can include multiple interconnected electrode structures each including multiple interdigital transducers 308 to achieve a desired passband (e.g., multiple interconnected resonators or interdigital transducers 308 in series or parallel connections to form a desired filter transfer function).

Although not explicitly shown, the electrode structure 302 can also include two or more reflectors. In an example implementation, the interdigital transducer 308 is arranged between two reflectors (not shown), which reflect the acoustic wave back towards the interdigital transducer 308. Each reflector within the electrode structure 302 can have two busbars and a grating structure of conductive fingers that each connect to both busbars. In some implementations, the pitch of the reflector can be similar to or the same as the pitch 408 of the interdigital transducer 308 to reflect the acoustic wave 406 in the resonant frequency range.

Figure 5:
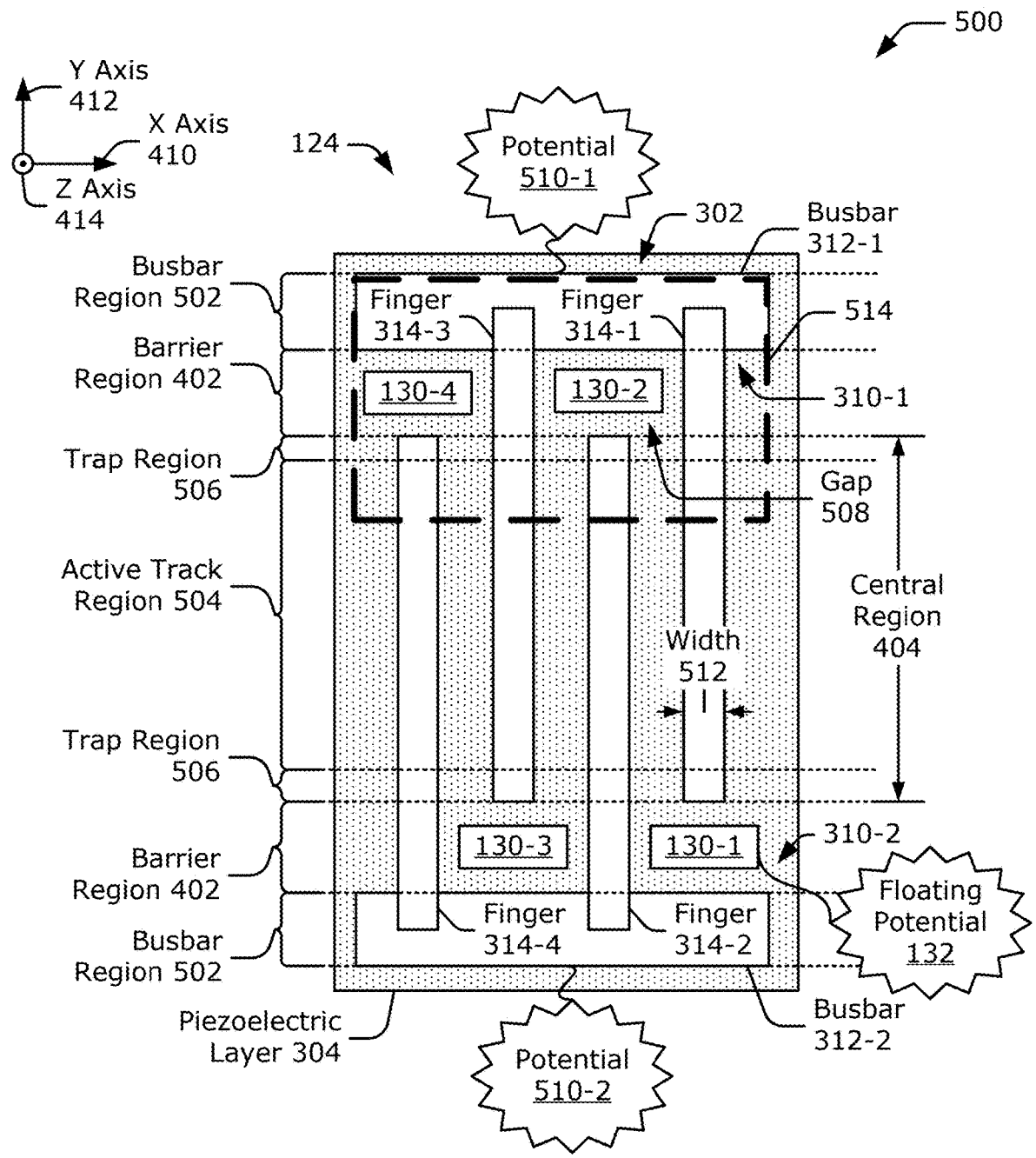
FIG. 5 illustrates a first example electrode structure of a surface-acoustic-wave filter with an electrical conductor having a floating potential.

FIG. 5 illustrates a first example implementation of the electrode structure 302 of the surface-acoustic-wave filter 124 with electrical conductors 130-1 to 130-4 having floating potentials 132. The surface-acoustic-wave filter 124 of FIG. 5 can be the thin-film surface-acoustic-wave filter 126 of FIG. 4-1 or the high-quality temperature-compensated surface-acoustic-wave filter 128 of FIG. 4-2.

As shown in a two-dimensional top-down view 500 of the surface-acoustic-wave filter 124, the electrode structure 302 of the surface-acoustic-wave filter 124 includes a first busbar 312-1, a second busbar 312-2, and fingers 314-1, 314-2, 314-3, and 314-4. The first busbar 312-1 and the fingers 314-1 and 314-3 form at least a portion of the first comb-shaped structure 310-1. The fingers 314-1 and 314-3 are connected to the first busbar 312-1 and extend along the second (Y) axis 412 towards the second busbar 312-2 without connecting to the second busbar 312-2. The second busbar 312-2 and the fingers 314-2 and 314-4 form at least a portion of the second comb-shaped structure 310-2. The fingers 314-2 and 314-4 are connected to the second busbar 312-2 and extend along the second (Y) axis 412 towards the first busbar 312-1 without connecting to the first busbar 312-1. The electrode structure 302 also includes electrical conductors 130-1, 130-2, 130-3, and 130-4, which are further described below.

The surface-acoustic-wave filter 124 includes multiple distinct regions along the second (Y) axis 412. These regions are defined, at least in part, based on a physical layout of the electrode structure 302. The regions include a busbar region 502, the barrier region 402, and the central region 404. The busbar region 502 includes the busbars 312-1 and 312-2 and extends across portions of the second (Y) axis 412 that correspond with the widths of the busbars 312-1 and 312-2. In this case, two busbar regions 502 are shown to be associated with the two busbars 312-1 and 312-2, respectively.

The barrier region 402 is present between the central region 404 and the busbar region 502. In particular, the barrier region 402 includes portions of the second (Y) axis 412 that extend between one busbar 312 and the ends of fingers 314 associated with another busbar 312 (e.g., an opposite busbar). For example, a first barrier region 402 exists between the first busbar 312-1 and the ends of fingers 314-2 and 314-4, which are associated with the second busbar 312-2. A second barrier region 402 exists between the second busbar 312-2 and ends of fingers 314-1 and 314-3, which are associated with the first busbar 312-1.

The central region 404 is defined by the overlap of fingers 314-1 to 314-4 across the first (X) axis 410. As depicted in the top-down view 500, the central region 404 includes at least one active track region 504 and at least one trap region 506. The trap region 506 is present between the barrier region 402 and the active track region 504. In this way, the trap region 506 exists at the outer boundaries of the central region 404. In general, the main or fundamental mode of the surface-acoustic-wave filter 124 is designed to propagate within the active track region 504.

A width of the trap region 506 along the second (Y) axis 412 can be tailored to achieve a target performance. In an example implementation, the width of the trap region 506 is approximately equal to the pitch 408 (of FIG. 4-1 or 4-2) of the electrode structure 302. For example, the width of the trap region 506 and the pitch 408 can be approximately 1 micrometer (μm). For clarity, the regions of the surface-acoustic-wave filter 124 are not necessarily drawn to scale in the top-down view 500. Further, each region may have some variability that deviates from the illustrated proportions or widths, including due to the constraints of a given manufacturing technology. For example, the trap region 506 may extend beyond the ends of fingers over which the trap region 506 is disposed.

The electrical conductors 130-1 to 130-4 are positioned within the barrier region 402 between the first comb-shaped structure 310-1 and the second comb-shaped structure 310-2. For example, the electrical conductors 130-1 and 130-3 are respectively positioned between the fingers 314-1 and 314-3 of the first comb-shaped structure 310-1 and the second busbar 312-2 of the second comb-shaped structure 310-2. Also, the electrical conductors 130-2 and 130-4 are respectively positioned between the fingers 314-2 and 314-4 of the second comb-shaped structure 310-2 and the first busbar 312-1 of the first comb-shaped structure 310-1.

The electrical conductors 130-1 to 130-4 are positioned such that a gap 508 or space of non-conducting material (e.g., air) exists between each of the electrical conductors 130-1 to 130-4 and the first and second comb-shaped structures 310-1 and 310-2. In FIG. 5, the piezoelectric layer 304 is visible through the gap 508. In general, a size of the gap 508 along the first (X) axis 410 or the second (Y) axis 412 is sufficient to enable admittances between each electrical conductor 130-1 to 130-4 and the first and second comb-shaped structures 310-1 and 310-2 to be approximately zero. In other words, the gap 508 causes impedances between each electrical conductor 130-1 to 130-4 and the first and second comb-shaped structures 310-1 and 310-2 to be significantly large and substantially prevent the formation of a direct conduction path between the electrical conductor 130-1 to 130-4 and the first or second comb-shaped structures 310-1 and 310-2. As an example, the size of the gap 508 along the first (X) axis 410 or the second (Y) axis 412 can be at least 0.05 micrometers (e.g., approximately 0.05, 0.1, or 0.15 micrometers). One of ordinary skill in the art can appreciate that these dimensions can vary for other example implementations of the surface-acoustic-wave filter 124. Due to the gap 508, the electrical conductors 130-1 to 130-4 are not directly connected electrically (e.g., galvanically) or physically to the first and second comb-shaped structures 310-1 and 310-2. This enables the electrical conductors 130-1 to 130-4 to have floating potentials 132.

Although the electrical conductors 130-1 to 130-4 are not directly connected to the first and second comb-shaped structures 310-1 and 310-2, the floating potential 132 of the electrical conductors 130-1 to 130-4 can be influenced by an electric field existing within the barrier region 402. In other words, the electrical conductors 130-1 to 130-4 can be electromagnetically coupled to the first and second comb-shaped structures 310-1 and 310-2. The electric field can be generated, at least in part, by a potential difference between the first comb-shaped structure 310-1 and the second comb-shaped structure 310-2. Consider an example in which the first comb-shaped structure 310-1 has a first potential 510-1 and the second comb-shaped structure 310-2 has a second potential 510-2, which differs from the first potential 510-1. Due to the position of the electrical conductors 130-1 to 130-4 between the first and second comb-shaped structures 310-1 and 310-2, the floating potential 132 of the electrical conductors 130-1 to 130-4 can have a value that is between values of the first and second potentials 510-1 and 510-2. In this way, the electrical conductors 130-1 to 130-4 can act as voltage dividers and effectively divide a difference between the potentials 510-1 and 510-2 to reduce the electric field within the barrier region 402. By reducing the electric field, the electrical conductors 130-1 to 130-4 can cause spurious frequencies, such as a second-order harmonic frequency, to be generated with a smaller amplitude compared to other surface-acoustic-wave filters that do not utilize the electrical conductors 130-1 to 130-4. Also, the presence of the electrical conductors 130-1 to 130-4 provides mass loading in the barrier region 402. This mass loading can mitigate excitation of spurious modes in the gap 508 and enable the linearity performance of the surface-acoustic-wave filter 124 to be preserved.

In general, the electrical conductors 130-1 to 130-4 can have any shape, orientation, or size that enables the electrical conductors 130-1 to 130-4 to have floating potentials 132. As an example, the electrical conductors 130-1 to 130-4 can have elliptical, circular, or rectangular shapes. Depending on the manufacturing process, the electrical conductors 130-1 to 130-4 can have relatively round or sharp edges. In some aspects, the electrical conductors 130-1 to 130-4 can be oriented such that a longest edge of the electrical conductors 130-1 to 130-4 is substantially parallel to a longest edge of the busbars 312-1 or 312-2. In other aspects, the electrical conductors 130-1 to 130-4 can be oriented such that the longest edge of the electrical conductors 130-1 to 130-4 is substantially parallel to the longest edge of the fingers 314-1 to 314-4. Generally, the orientation of the electrical conductors 130-1 to 130-4 relative to the busbars 312-1 and 312-2 or the fingers 314-1 to 314-4 can form an angle between approximately 0 and 180 degrees.

In an example implementation, a size of one or more of the electrical conductors 130-1 to 130-4 across the first (X) axis 410 is at least 50% of a width 512 of one of the fingers 314-1 to 314-4. The size of the electrical conductors 130-1 to 130-4 across the first (X) axis 410 can also be greater than a width 512 of one of the fingers 314-1 to 314-4, as shown in FIG. 5. Depending on resolutions achievable with available manufacturing processes, smaller sizes are also possible (e.g., less than 50% of the width 512 of the fingers 314-1 to 314-4). Generally, the size of the electrical conductors 130-1 to 130-4 across the first (X) axis 410 is constrained by a distance between adjacent fingers 314 of the first or second comb-shaped structure 310-1 or 310-2. Additionally, the size of the electrical conductors 130-1 to 130-4 across the second (Y) axis 412 is constrained by a size of the barrier region 402 along the second (Y) axis 412.

The electrical conductors 130-1 to 130-4 can exist anywhere within the barrier region 402. In one example, a center of at least one of the electrical conductors 130-1 to 130-4 can be aligned to a center of a corresponding finger 314-1 to 314-4 with respect to the first (X) axis 412 (e.g., the centers exist at a same position along the first (X) axis 412). In another example, a center of at least one of the electrical conductors 130-1 to 130-4 can be offset from a center of a corresponding finger 314-1 to 314-4 with respect to the first (X) axis 410 (e.g., the centers exist at different positions along the first (X) axis 412).

Use of the electrical conductors 130-1 to 130-4 can reduce the amplitudes of spurious frequencies without significantly changing other properties of the surface-acoustic-wave filter 124, such as s-parameters or admittance. Sometimes the electrical conductors 130-1 to 130-4 can introduce spurious modes, which can negatively impact the performance of the surface-acoustic-wave filter 124. To address this, some surface-acoustic-wave filters 124 use piston-mode techniques to attenuate these spurious modes.

In some aspects, the piston-mode techniques customize a geometry of the electrode structure 302. As an example, the fingers 314 within the electrode structure 302 can have varying widths or heights across the length of the fingers 314. In particular, a finger 314 can have a wider and/or taller profile (e.g., include a hammerhead or a dot, respectively) within the trap region 506 relative to the active track region 504. The wider and/or taller profile can be realized by applying conducting material, such as metal, and/or a dielectric material. This additional material increases a mass of the fingers 314 within the trap region 506 relative to the active track region 504.

A portion 514 of the electrode structure 302 is further described with respect to other configurations of the electrode structure 302 in FIGS. 6-9. As shown in FIG. 5, the portion 514 includes an "upper" portion (as depicted on the drawing sheet) of the surface-acoustic-wave filter 124. In particular, the portion 514 includes the busbar region 502, the barrier region 402, and the trap region 506, which are "above" (as depicted on the drawing sheet) the active track region 504. Although only the portion 514 is explicitly depicted in FIGS. 6-9, a "lower" portion of the electrode structure 302 (e.g., the regions "below" the active track region 504) can have a similar configuration as the portion 514. Example configurations of the electrode structure 302 are further described with respect to FIGS. 6-9.

Figure 6:
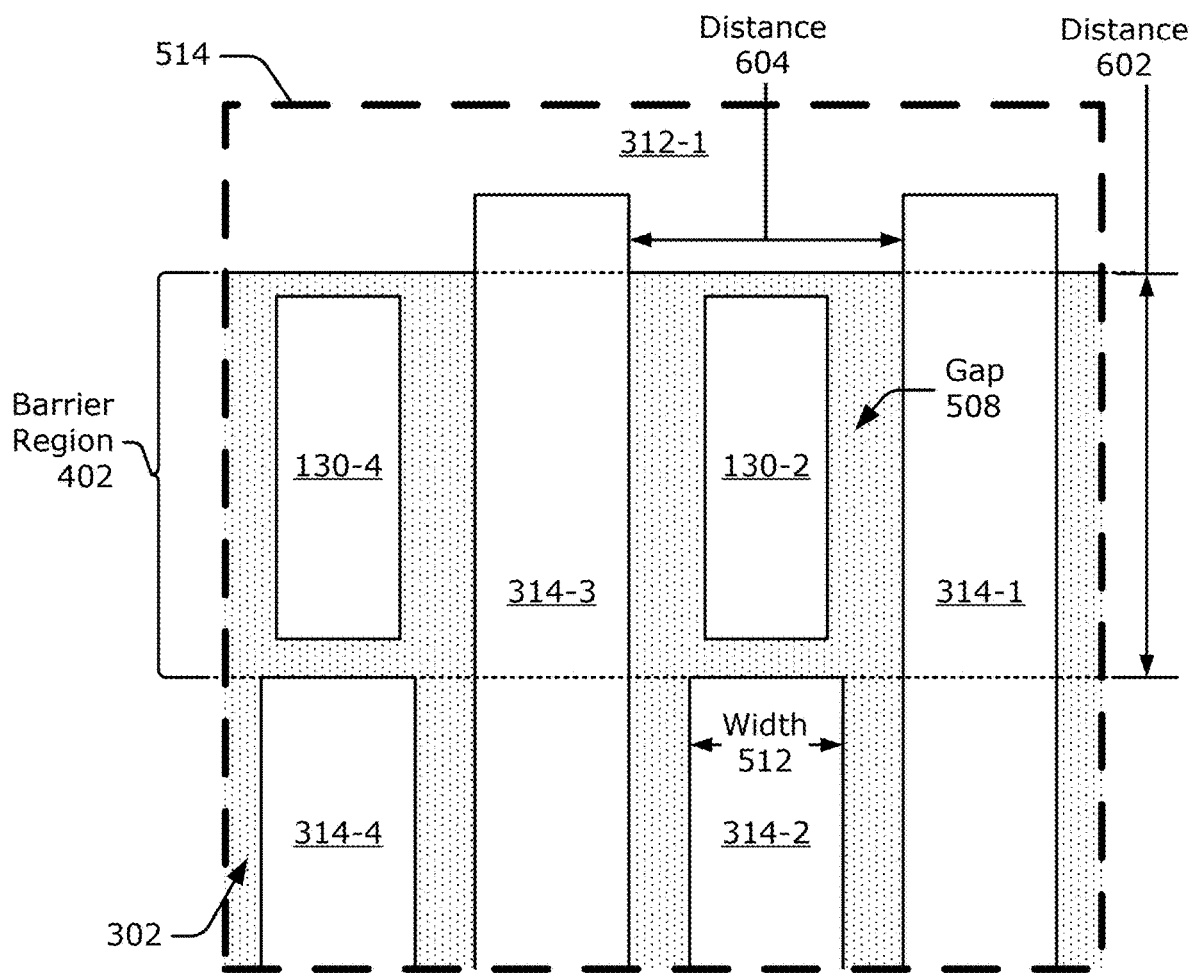
FIG. 6 illustrates a second example electrode structure of a surface-acoustic-wave filter with an electrical conductor having a floating potential.

FIG. 6 illustrates a portion 514 of a second example electrode structure 302 of the surface-acoustic-wave filter 124. In this example, a distance 602 between the first busbar 312-1 and the fingers 314-2 and 314-2 is greater than a distance 604 between adjacent fingers 314 of the first comb-shaped structure 310-1 (e.g., between the fingers 314-1 and 314-3). As such, the electrical conductors 130-2 and 130-4 can have shapes that are longer across the second (Y) axis 412 compared to the first (X) axis 410. In this example, a size of the electrical conductors 130-2 and 130-4 across the first (X) axis 410 is between 20% and 100% of the width 512 of the fingers 314-2 and 314-4 (e.g., between 30%, 50%, or 80% of the width 512 of the fingers 314-2 and 314-4).

Figure 7:
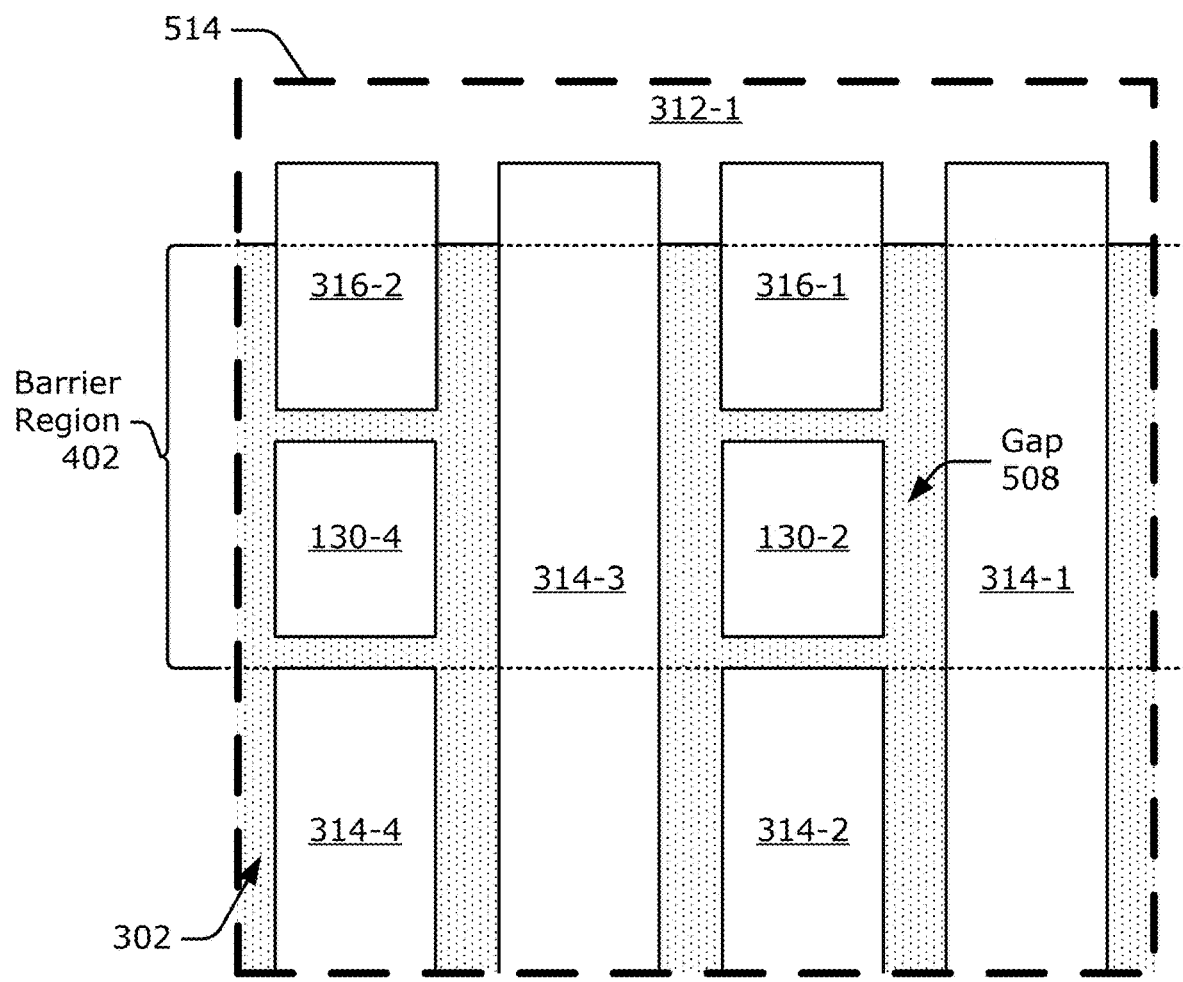
FIG. 7 illustrates a third example electrode structure of a surface-acoustic-wave filter with an electrical conductor having a floating potential.

FIG. 7 illustrates a portion 514 of a third example electrode structure 302 of the surface-acoustic-wave filter 124. In this example, the electrode structure 302 includes one or more dummy fingers 316 (e.g., dummy fingers 316-1 and 316-2). The dummy fingers 316-1 and 316-2 respectively extend from the first busbar 312-1 towards the fingers 314-2 and 314-4 of the second comb-shaped structure 310-2 without touching the fingers 314-2 and 314-4. In this manner, the dummy fingers 316 exist within the barrier region 402. In general, the dummy fingers 316 are positioned between adjacent fingers 314 of the first comb-shaped structure 310-1. In the depicted configuration, the dummy finger 316-1 is positioned between the fingers 314-1 and 314-3.

The electrical conductors 130-2 and 130-4 are respectively positioned within the barrier region 402 between the dummy fingers 316-1 and 316-2 and the fingers 314-2 and 314-4. The gap 508 exists around the electrical conductors 130-2 and 130-4 and separates the electrical conductors 130-2 and 130-4 from the dummy fingers 316-1 and 316-2.

Figure 8:
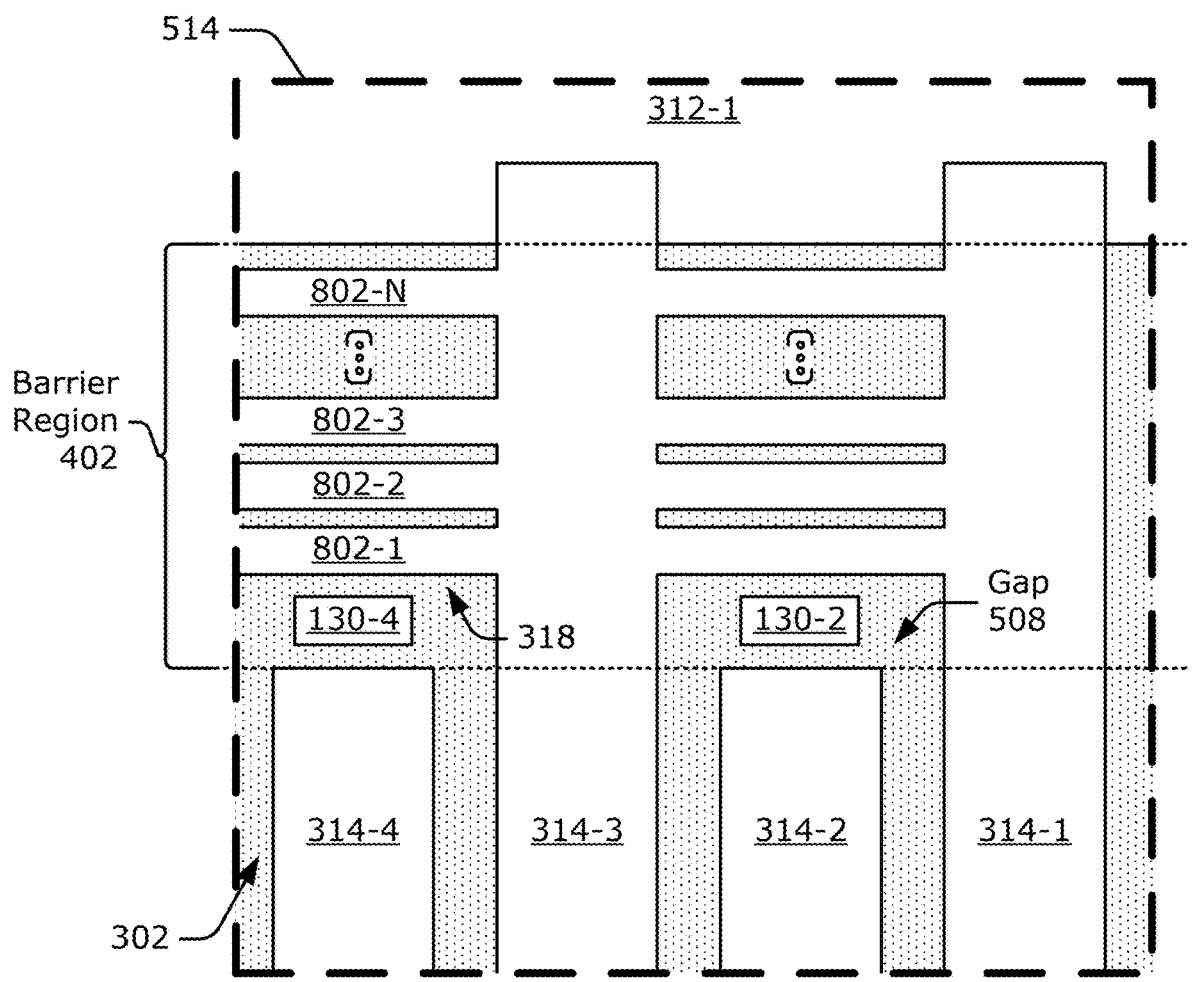
FIG. 8 illustrates a fourth example electrode structure of a surface-acoustic-wave filter with an electrical conductor having a floating potential.

FIG. 8 illustrates a portion 514 of a fourth example electrode structure 302 of the surface-acoustic-wave filter 124. In this example, the electrode structure 302 includes at least one gap-short structure 318. The gap-short structure 318 includes at least one conductive strip 802, which connects (e.g., shorts) at least two fingers 314 of the first comb-shaped structure 310-1. In the depicted configuration, the gap-short structure includes multiple conductive strips 802-1 to 802-N, where N represents a positive integer. The conductive strips 802-1 to 802-N connect the fingers 314-1 and 314-3 of the first comb-shaped structure 310-1. Although not shown, the conductive strips 802-1 to 802-N can also connect the fingers 314-1 and 314-3 to other fingers of the first comb-shaped structure 310-1.

In this case, the electrical conductors 130-2 and 130-4 are positioned between the gap-short structure 318 and the fingers 314-2 and 314-4. In particular, the electrical conductors 130-2 and 130-4 are respectively positioned between the conductive strip 802-1 and the fingers 314-2 and 314-4. In this way, the electrical conductors 130-2 and 130-4 can reduce the electric field between the second comb-shaped structure 310-2 and the gap-short structure 318. In this case, the gap 508 separates the electrical conductors 130-2 and 130-4 from the gap-short structure 318. In some implementations, the electrical conductors 130-2 and 130-4 can be formed by physically separating a portion of the gap-short structure 318, such as one of the conductive strips 802, from the fingers 314-1 and 314-3. In this way, the electrical conductors 130-2 and 130-4 can provide the acoustic effect of the gap-short structure 318 along with the effect of reducing the transversal electric field.

Figure 9:
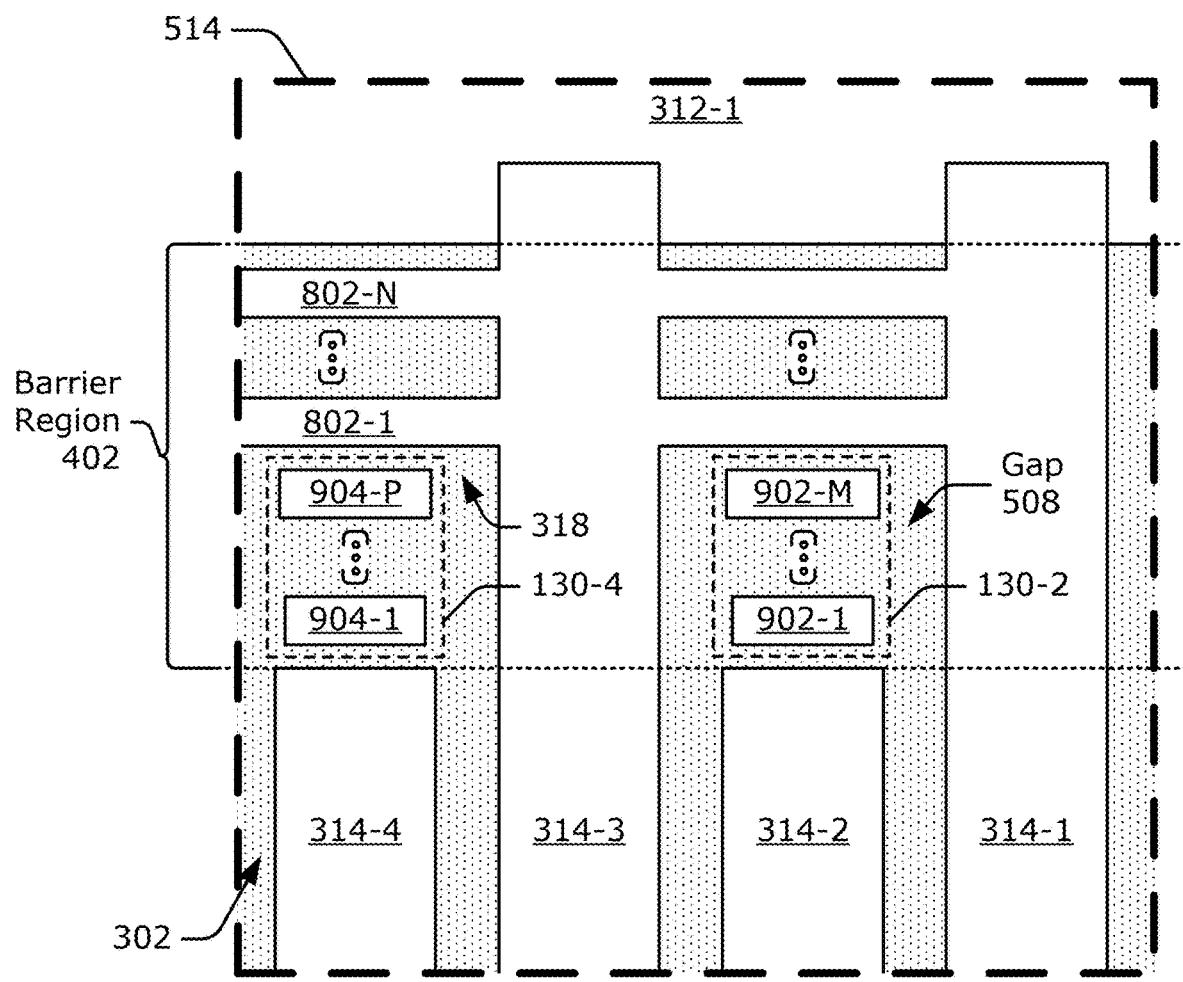
FIG. 9 illustrates a fifth example electrode structure of a surface-acoustic-wave filter with an electrical conductor having a floating potential.

FIG. 9 illustrates a portion 514 of a fifth example electrode structure 302 of the surface-acoustic-wave filter 124. The electrode structure 302 of FIG. 9 is similar to the electrode structure 302 of FIG. 8, except the electrical conductors 130-2 and 130-4 are represented by multiple electrical conductors. For example, electrical conductors 902-1 to 902-M represent the electrical conductor 130-2, and electrical conductors 904-1 to 904-P represent the electrical conductor 130-4. The variables M and P represent positive integers, which may or may not be equal to each other.

In the depicted configuration, the electrical conductors 902-1 to 902-M are positioned between the finger 314-2 and the conductive strip 802-1 of the gap-short structure 318. Also, the electrical conductors 904-1 to 904-P are positioned between the finger 314-4 and the conductive strip 802-1 of the gap-short structure 318. The gap 508 separates the electrical conductors 902-1 to 902-M and 904-1 to 904-P from each other as well as the gap-short structure 318. Some implementations form the electrical conductors 902-1 to 902-M and 904-1 to 904-P by physically separating multiple conductive strips 802 of the gap-short structure 318 from the fingers 314-1 and 314-3.

Figure 10:
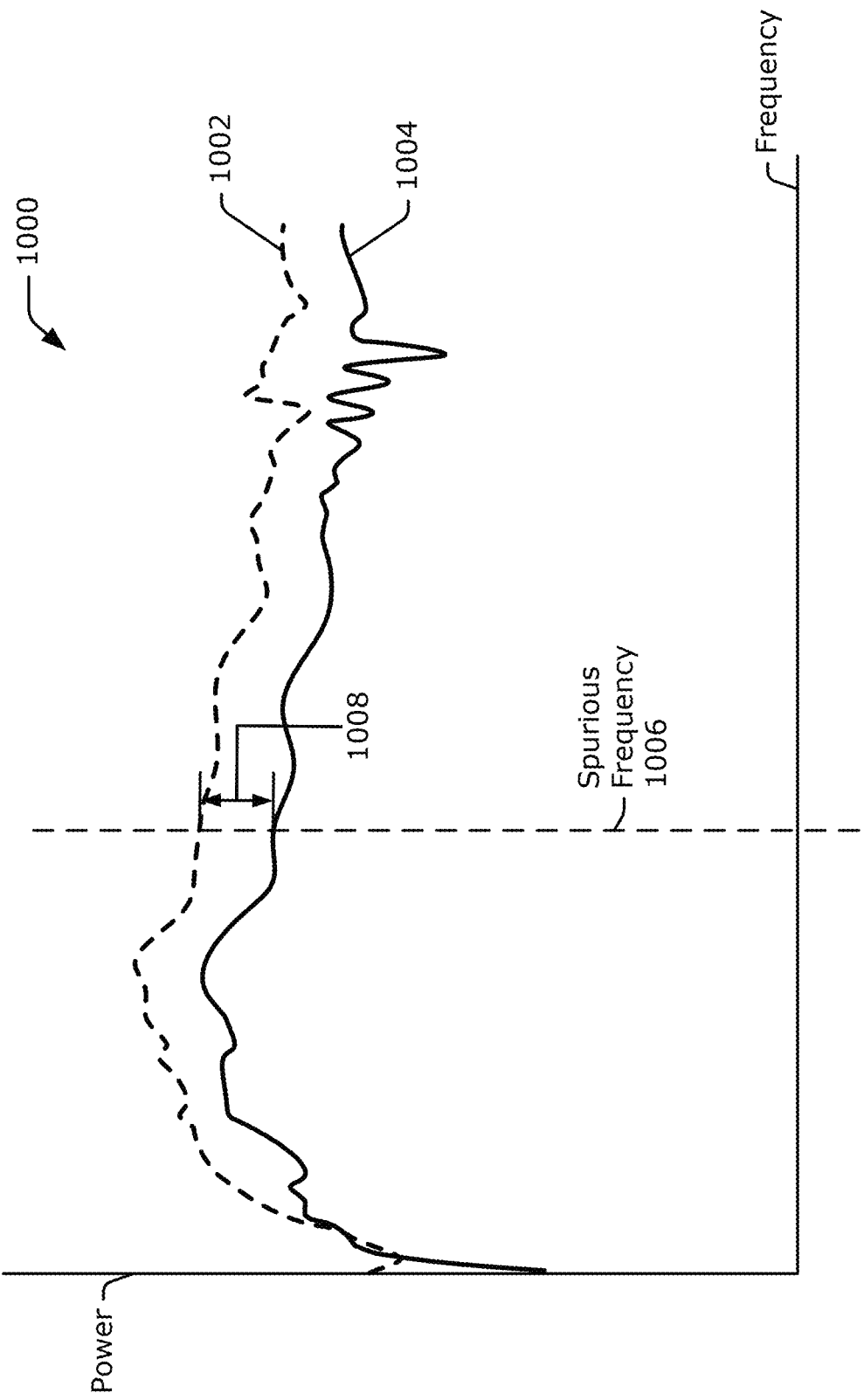
FIG. 10 illustrates example frequency responses for implementations of a surface-acoustic-wave filter that does or does not include an electrical conductor having a floating potential.

FIG. 10 illustrates example frequency responses for implementations of a surface-acoustic-wave filter that do or do not include an electrical conductor 130 having a floating potential 132. A graph 1000 depicts a frequency response 1002 of another surface-acoustic-wave filter that does not include the electrical conductor 130. The graph 1000 also depicts a frequency response 1004 of the surface-acoustic-wave filter 124, which includes one or more electrical conductors 130. Due to the existence of the electrical conductors 130, the frequency response 1004 of the surface-acoustic-wave filter 124 can attenuate a spurious frequency 1006, such as a second-order harmonic frequency, by a greater amount than the other surface-acoustic-wave filter that does not include the electrical conductors 130, as shown at 1008. In some cases, this attenuation can be on the order of a few decibels (dB) or more (e.g., approximately 2, 3, or 5 dB).

Figure 11:
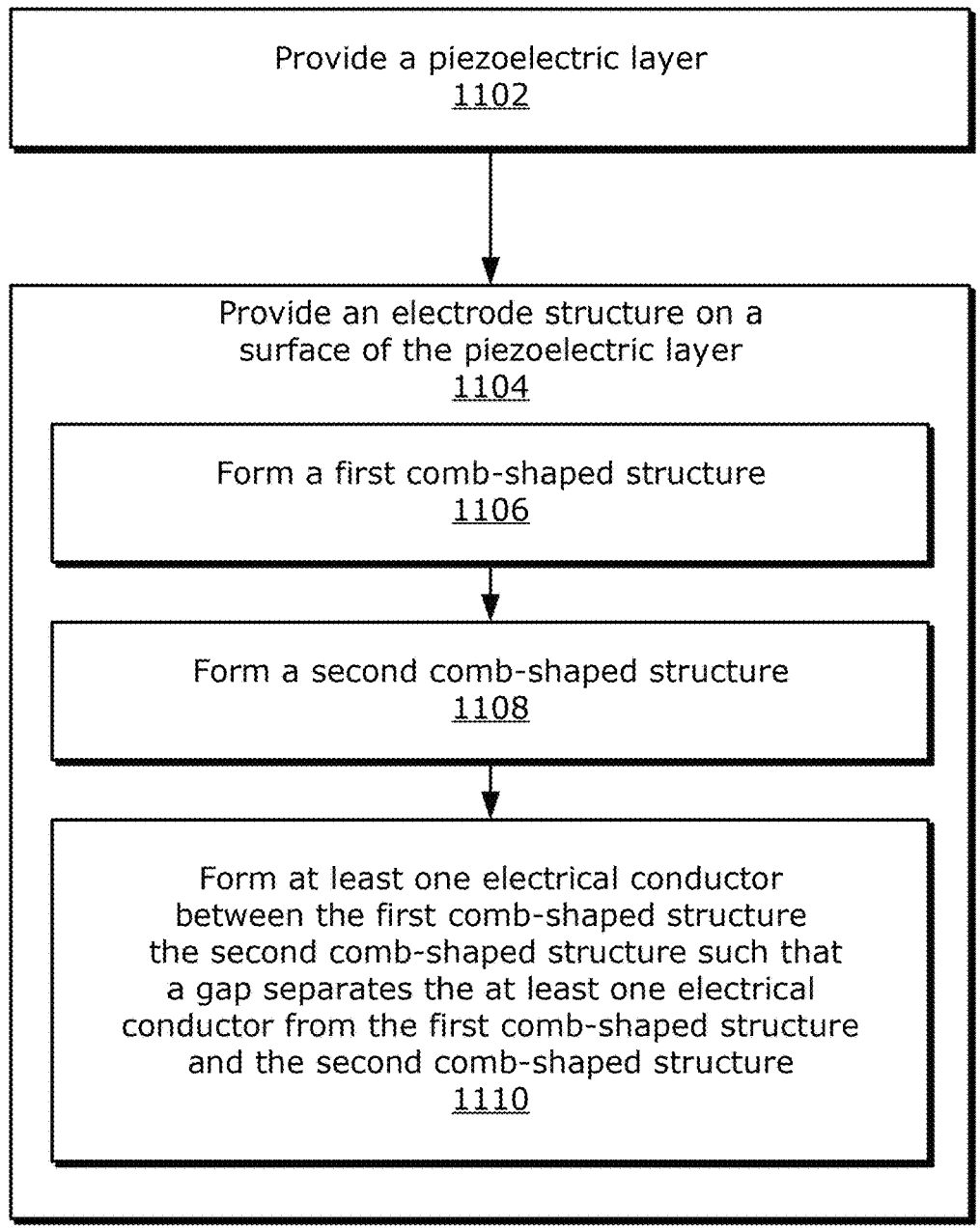
FIG. 11 is a flow diagram illustrating an example process for manufacturing a surface-acoustic-wave filter with an electrical conductor having a floating potential.

FIG. 11 is a flow diagram illustrating an example process 1100 for manufacturing a surface-acoustic-wave filter 124 with an electrical conductor 130 having a floating potential 132. The process 1100 is described in the form of a set of blocks 1102-1110 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100, or an alternative process. Operations represented by the illustrated blocks of the process 1100 may be performed to manufacture the surface-acoustic-wave filter 124 (e.g., of FIGS. 1 to 4-2). More specifically, the operations of the process 1100 may be performed, at least in part, to create an electrical conductor 130 (e.g., of FIGS. 3 to 9) having a floating potential 132.

At 1102, a piezoelectric layer is provided. For example, a manufacturing process provides a piezoelectric layer 304, as shown in FIGS. 4-1 to 9. The piezoelectric layer 304 can be implemented using materials such as lithium niobate, lithium tantalate, quartz, aluminium nitride, aluminium scandium nitride, or some combination thereof.

At 1104, an electrode structure is provided on a surface of the piezoelectric layer. For example, the manufacturing process provides the electrode structure 302 on the surface of the piezoelectric layer 304, as shown in FIGS. 4-1 to 9. The electrode structure 302 can be formed using an electrically conductive material, such as metal.

At 1106, the providing of the electrode structure includes forming a first comb-shaped structure. For example, the manufacturing process forms the first comb-shaped structure 310-1, as shown in FIGS. 4-1 and 4-2. The first comb-shaped structure 310-1 can include the first busbar 312-1 and a set of fingers 314 (e.g., fingers 314-1 and 314-3). The first comb-shaped structure 310-1 can have a first potential 510-1, as shown in FIG. 5.

At 1108, the providing of the electrode structure includes forming a second comb-shaped structure. For example, the manufacturing process forms the second comb-shaped structure 310-2, as shown in FIGS. 4-1 and 4-2. The second comb-shaped structure 310-2 can include the second busbar 312-2 and a set of fingers 314 (e.g., fingers 314-2 and 314-4). The second comb-shaped structure 310-2 can have a second potential 510-2, which differs from the first potential 510-1.

At 1110, the providing of the electrode structure includes forming at least one electrical conductor between the first comb-shaped structure and the second comb-shaped structure such that a gap separates the at least one electrical conductor from the first comb-shaped structure and the second comb-shaped structure. For example, the manufacturing process forms at least one electrical conductor 130 between the first comb-shaped structure 310-1 and the second comb-shaped structure 310-2 such that a gap 508 separates the at least one electrical conductor 130 from the first comb-shaped structure 310-1 and the second comb-shaped structure 310-2, as shown in FIGS. 5-9. Due to the gap 508, the electrical conductor 130 can have a floating potential 132. A non-conducting material, such as air, can occupy the gap 508. In general, the techniques for providing the electrode structure 302 can include using a masking and deposition process or using an etching process.

Some aspects are described below.

Aspect 1: An apparatus comprising:
  a surface-acoustic-wave filter comprising:
    a piezoelectric layer; and
    an electrode structure disposed on a surface of the piezoelectric layer, the electrode structure comprising:
      a first comb-shaped structure:
      a second comb-shaped structure; and
      at least one electrical conductor positioned between the first comb-shaped structure and the second comb-shaped structure such that a gap separates the at least one electrical conductor from the first comb-shaped structure and the second comb-shaped structure.

Aspect 2: The apparatus of aspect 1, wherein:
the first comb-shaped structure comprises a first busbar and a first set of fingers extending from the first busbar;
the second comb-shaped structure comprises a second busbar and a second set of fingers extending from the second busbar; and
the at least one electrical conductor is positioned between the first busbar and a finger of the second set of fingers.

Aspect 3: The apparatus of aspect 2, wherein the at least one electrical conductor comprises:
a first electrical conductor positioned between the first busbar and the finger of the second set of fingers; and
a second electrical conductor positioned between the second busbar and a finger of the first set of fingers.

Aspect 4: The apparatus of aspect 3, wherein the at least one electrical conductor comprises:
a third electrical conductor positioned between the first busbar and another finger of the second set of fingers; and
a fourth electrical conductor positioned between the second busbar and another finger of the first set of fingers.

Aspect 5: The apparatus of any one of aspects 2 to 4, wherein:
the electrode structure comprises at least one dummy finger extending from the first busbar between two adjacent fingers of the first set of fingers; and
the at least one electrical conductor is positioned between the at least one dummy finger and the finger of the second set of fingers.

Aspect 6: The apparatus of any one of aspects 2 to 5, wherein:
the electrode structure comprises at least one conductive strip connected to at least two adjacent fingers of the first set of fingers; and
the at least one electrical conductor is positioned between the at least one conductive strip and the finger of the second set of fingers.

Aspect 7: The apparatus of aspect 6, wherein the at least one electrical conductor comprises multiple electrical conductors positioned between the at least one conductive strip and the finger of the second set of fingers.

Aspect 8: The apparatus of any one of aspects 2 to 7, wherein:
the piezoelectric layer has a planar surface defined by a first (X) axis and a second (Y) axis that is perpendicular to the first (X) axis;
lengths of the first and second busbars are substantially parallel to the first (X) axis; and
lengths of fingers within the first set of fingers and the second set of fingers are substantially parallel to the second (Y) axis.

Aspect 9: The apparatus of aspect 8, wherein the piezoelectric layer is configured to propagate an acoustic wave along the first (X) axis.

Aspect 10: The apparatus of aspect 8 or 9, wherein a size of the at least one electrical conductor along the first (X) axis is at least 50% of a width of the finger of the second set of fingers.

Aspect 11: The apparatus of any one of aspects 8 to 10, wherein a center of the at least one electrical conductor is aligned with a center of the finger of the second set of fingers with respect to the first (X) axis.

Aspect 12: The apparatus of any one of aspects 8 to 11, wherein:
the at least one electrical conductor is positioned between two adjacent fingers of the first set of fingers along the first (X) axis; and
the at least one electrical conductor is positioned between the first busbar and the finger of the second set of fingers along the second (Y) axis.

Aspect 13: The apparatus of any one of aspects 8 to 12, wherein:
a distance between the finger of the second set of fingers and the first busbar along the second (Y) axis is greater than a distance between two adjacent fingers of the first set of fingers along the first (X) axis; and
the at least one electrical conductor has a shape that is longer across the second (Y) axis compared to the first (X) axis.

Aspect 14: The apparatus of any previous aspect, wherein the at least one electrical conductor has a floating potential based on the gap.

Aspect 15: The apparatus of any previous aspect, wherein a non-conducting material occupies the gap.

Aspect 16: The apparatus of aspect 15, wherein the non-conducting material comprises air.

Aspect 17: The apparatus of any previous aspect, wherein:
a first distance between the at least one electrical conductor and the first comb-shaped structure causes an admittance between the at least one electrical conductor and the first comb-shaped structure to be approximately equal to zero; and
a second distance between the at least one electrical conductor and the second comb-shaped structure causes an admittance between the at least one electrical conductor and the second comb-shaped structure to be approximately equal to zero.

Aspect 18: The apparatus of aspect 17, wherein the first distance or the second distance is at least 0.05 micrometers.

Aspect 19: The apparatus of any previous aspect, wherein the at least one electrical conductor, the first comb-shaped structure, and the second comb-shaped structure comprise a same material.

Aspect 20: The apparatus of aspect 19, wherein the same material comprises at least one of the following:
aluminium;
copper;
silver;
gold; or
tungsten.

Aspect 21: The apparatus of any previous aspect, wherein:
the surface-acoustic-wave filter comprises multiple cascaded resonators; and a resonator of the multiple cascaded resonators comprises the piezoelectric layer.

Aspect 22: The apparatus of any previous aspect, further comprising:
a wireless transceiver coupled to at least one antenna, the wireless transceiver comprising the surface-acoustic-wave filter and configured to filter, using the surface-acoustic-wave filter, a wireless signal communicated via the at least one antenna.

Aspect 23: The apparatus of any previous aspect, wherein the surface-acoustic-wave filter comprises a thin-film surface-acoustic-wave filter.

Aspect 24: The apparatus of any previous aspect, wherein the surface-acoustic-wave filter comprises a high-quality temperature-compensated surface-acoustic-wave filter.

Aspect 25: An apparatus comprising:
a surface-acoustic-wave filter configured to generate a filtered signal from a radio-frequency signal, the surface-acoustic-wave filter comprising:
means for converting the radio-frequency signal to an acoustic wave and converting a propagated acoustic wave into the filtered signal using two potentials; and
conduction means for providing a floating potential between the two potentials.

Aspect 26: The apparatus of aspect 25, wherein the conduction means comprises means for attenuating, within a barrier region of the surface-acoustic-wave filter, an electric field in a transversal direction based on the floating potential.

Aspect 27: The apparatus of aspect 26, wherein the conduction means comprises means for attenuating a second-order harmonic frequency of the surface-acoustic-wave filter based on attenuation of the electric field.

Aspect 28: A method of manufacturing a surface-acoustic-wave filter, the method comprising:
providing a piezoelectric layer; and
providing an electrode structure on a surface of the piezoelectric layer, the providing of the electrode structure comprising:
forming a first comb-shaped structure;
forming a second comb-shaped structure; and
forming at least one electrical conductor between the first comb-shaped structure and the second comb-shaped structure such that a gap separates the at least one electrical conductor from the first comb-shaped structure and the second comb-shaped structure.

Aspect 29: The method of aspect 28, wherein the forming of the at least one electrical conductor comprises forming the at least one electrical conductor within a barrier region of the surface-acoustic-wave filter.

Aspect 30: The method of aspect 28 or 29, wherein:
the forming of the first comb-shaped structure comprises forming a first busbar and a first set of fingers extending from the first busbar;
the forming of the second comb-shaped structure comprises forming a second busbar and a second set of fingers extending from the second busbar; and
the forming of the at least one electrical conductor comprises:
forming a first electrical conductor between the first busbar and a finger of the second set of fingers; and forming a second electrical conductor between the second busbar and a finger of the first set of fingers.

Aspect 31: A surface-acoustic-wave filter comprising: an electrode structure, the electrode structure comprising:
two comb-shaped structures configured to have different potentials, the two comb-shaped structures forming a barrier region between a busbar of one of the two comb-shaped structures and fingers of another one of the two comb-shaped structures; and
at least one electrical conductor positioned within the barrier region and configured to have a floating potential.

Aspect 32: The surface-acoustic-wave filter of aspect 31, wherein the at least one electrical conductor is not galvanically connected to the two comb-shaped structures.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a surface-acoustic-wave filter comprising:
a piezoelectric layer; and
an electrode structure disposed on a surface of the piezoelectric layer, the electrode structure comprising:
a first comb-shaped structure comprising a first busbar and a first set of fingers extending from the first busbar;
a second comb-shaped structure comprising a second busbar and a second set of fingers extending from the second busbar; and
at least one electrical conductor positioned between the first comb-shaped structure and the second comb-shaped structure such that a gap separates the at least one electrical conductor from the first comb-shaped structure and the second comb-shaped structure, wherein the at least one electrical conductor comprises:
a first electrical conductor positioned between the first busbar and a finger of the second set of fingers;
a second electrical conductor positioned between the second busbar and a finger of the first set of fingers;
a third electrical conductor positioned between the first busbar and another finger of the second set of fingers; and
a fourth electrical conductor positioned between the second busbar and another finger of the first set of fingers.

2. The apparatus of claim 1, wherein:
the electrode structure comprises at least one dummy finger extending from the first busbar between two adjacent fingers of the first set of fingers; and
the at least one electrical conductor is positioned between the at least one dummy finger and the finger of the second set of fingers.

3. The apparatus of claim 1, wherein:
the electrode structure comprises at least one conductive strip connected to at least two adjacent fingers of the first set of fingers; and
the at least one electrical conductor is positioned between the at least one conductive strip and the finger of the second set of fingers.

4. The apparatus of claim 3, wherein the at least one electrical conductor comprises multiple electrical conductors positioned between the at least one conductive strip and the finger of the second set of fingers.

5. The apparatus of claim 1, wherein:
the piezoelectric layer has a planar surface defined by a first (X) axis and a second (Y) axis that is perpendicular to the first (X) axis;
lengths of the first and second busbars are substantially parallel to the first (X) axis; and
lengths of fingers within the first set of fingers and the second set of fingers are substantially parallel to the second (Y) axis.

6. The apparatus of claim 5, wherein the piezoelectric layer is configured to propagate an acoustic wave along the first (X) axis.

7. The apparatus of claim 5, wherein a size of the at least one electrical conductor along the first (X) axis is at least 50% of a width of the finger of the second set of fingers.

8. The apparatus of claim 5, wherein a center of the at least one electrical conductor is aligned with a center of the finger of the second set of fingers with respect to the first X) axis.

9. The apparatus of claim 5, wherein:
the at least one electrical conductor is positioned between two adjacent fingers of the first set of fingers along the first (X) axis; and
the at least one electrical conductor is positioned between the first busbar and the finger of the second set of fingers along the second (Y) axis.

10. The apparatus of claim 5, wherein:
a distance between the finger of the second set of fingers and the first busbar along the second (Y) axis is greater than a distance between two adjacent fingers of the first set of fingers along the first (X) axis; and
the at least one electrical conductor has a shape that is longer across the second (Y) axis compared to the first (X) axis.

11. The apparatus of claim 1, wherein the at least one electrical conductor has a floating potential based on the gap.

12. The apparatus of claim 1, wherein a non-conducting material occupies the gap.

13. The apparatus of claim 12, wherein the non-conducting material comprises air.

14. The apparatus of claim 1, wherein:
a first distance between the at least one electrical conductor and the first comb-shaped structure causes an admittance between the at least one electrical conductor and the first comb-shaped structure to be approximately equal to zero; and
a second distance between the at least one electrical conductor and the second comb-shaped structure causes an admittance between the at least one electrical conductor and the second comb-shaped structure to be approximately equal to zero.

15. The apparatus of claim 14, wherein at least one the first distance or the second distance is at least 0.05 micrometers.

16. The apparatus of claim 1, wherein the at least one electrical conductor, the first comb-shaped structure, and the second comb-shaped structure comprise a same material.

17. The apparatus of claim 16, wherein the same material comprises at least one of the following:
aluminum;
copper;
silver;
gold; or
tungsten.

18. The apparatus of claim 1, wherein:
the surface-acoustic-wave filter comprises multiple cascaded resonators; and
a resonator of the multiple cascaded resonators comprises the piezoelectric layer.

19. The apparatus of claim 1, further comprising:
a wireless transceiver coupled to at least one antenna, the wireless transceiver comprising the surface-acoustic-wave filter and configured to filter, using the surface-acoustic-wave filter, a wireless signal communicated via the at least one antenna.

20. The apparatus of claim 1, wherein the surface-acoustic-wave filter comprises a thin-film surface-acoustic-wave filter.

21. The apparatus of claim 1, wherein the surface-acoustic-wave filter comprises a high-quality temperature-compensated surface-acoustic-wave filter.

22. A method of manufacturing a surface-acoustic-wave filter, the method comprising:
providing a piezoelectric layer; and
providing an electrode structure on a surface of the piezoelectric layer, the providing of the electrode structure comprising:
forming a first comb-shaped structure comprising a first busbar and a first set of fingers extending from the first busbar;
forming a second comb-shaped structure comprising a second busbar and a second set of fingers extending from the second busbar; and
forming at least one electrical conductor between the first comb-shaped structure and the second comb-shaped structure such that a gap separates the at least one electrical conductor from the first comb-shaped structure and the second comb-shaped structure, wherein the at least one electrical conductor comprises:
a first electrical conductor positioned between the first busbar and a finger of the second set of fingers;
a second electrical conductor positioned between the second busbar and a finger of the first set of fingers;
a third electrical conductor positioned between the first busbar and another finger of the second set of fingers; and
a fourth electrical conductor positioned between the second busbar and another finger of the first set of fingers.

23. The method of claim 22, wherein the forming of the at least one electrical conductor comprises forming the at least one electrical conductor within a barrier region of the surface-acoustic-wave filter.

24. A surface-acoustic-wave filter comprising:
an electrode structure, the electrode structure comprising:
two comb-shaped structures configured to have different potentials, the two comb-shaped structures forming a barrier region between a busbar of one of the two comb-shaped structures and fingers of another one of the two comb-shaped structures; and
at least one electrical conductor positioned within the barrier region and configured to have a floating potential, wherein the at least one electrical conductor comprises:
a first electrical conductor positioned between a busbar of a first comb-shaped structure of the two comb-shaped structures and a finger of a second comb-shaped structure of the two comb-shaped structures;
a second electrical conductor positioned between a busbar of the second comb-shaped structure and a finger of the first comb-shaped structure;
a third electrical conductor positioned between the busbar of the first comb-shaped structure and another finger of the second comb-shaped structure; and
a fourth electrical conductor positioned between the busbar of the second comb-shaped structure and another finger of the first comb-shaped structure.

25. The surface-acoustic-wave filter of claim 24, wherein the at least one electrical conductor is not galvanically connected to the two comb-shaped structures.

26. An apparatus comprising:
a surface-acoustic-wave filter comprising:
a piezoelectric layer; and
an electrode structure disposed on a surface of the piezoelectric layer, the electrode structure comprising:
a first comb-shaped structure;
a second comb-shaped structure; and
at least one electrical conductor positioned between the first comb-shaped structure and the second comb-shaped structure such that a gap separates the at least one electrical conductor from the first comb-shaped structure and the second comb-shaped structure, wherein:
a first distance between the at least one electrical conductor and the first comb-shaped structure causes an admittance between the at least one electrical conductor and the first comb-shaped structure to be approximately equal to zero; and
a second distance between the at least one electrical conductor and the second comb-shaped structure causes an admittance between the at least one electrical conductor and the second comb-shaped structure to be approximately equal to zero.

27. The apparatus of claim 26, wherein the at least one electrical conductor has a floating potential based on the gap.

28. The apparatus of claim 26, wherein a non-conducting material occupies the gap.

29. The apparatus of claim 28, wherein the non-conducting material comprises air.

30. The apparatus of claim 26, wherein at least one of the first distance or the second distance is at least 0.05 micrometers.

31. The apparatus of claim 26, wherein the at least one electrical conductor, the first comb-shaped structure, and the second comb-shaped structure comprise a same material.

32. The apparatus of claim 26, wherein:
- the surface-acoustic-wave filter comprises multiple cascaded resonators; and
- a resonator of the multiple cascaded resonators comprises the piezoelectric layer.

* * * * *